(12) United States Patent
Yakubo et al.

(10) Patent No.: US 12,081,171 B2
(45) Date of Patent: Sep. 3, 2024

(54) SEMICONDUCTOR DEVICE

(71) Applicant: Semiconductor Energy Laboratory Co., Ltd., Kanagawa-ken (JP)

(72) Inventors: Yuto Yakubo, Kanagawa (JP); Shoki Miyata, Kanagawa (JP); Akio Suzuki, Kanagawa (JP); Takayuki Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 5 days.

(21) Appl. No.: 17/923,653

(22) PCT Filed: May 7, 2021

(86) PCT No.: PCT/IB2021/053880
§ 371 (c)(1),
(2) Date: Nov. 7, 2022

(87) PCT Pub. No.: WO2021/229385
PCT Pub. Date: Nov. 18, 2021

(65) Prior Publication Data
US 2023/0188094 A1 Jun. 15, 2023

(30) Foreign Application Priority Data

May 15, 2020 (JP) ................................ 2020-085605

(51) Int. Cl.
*H03D 7/14* (2006.01)
*H01L 29/786* (2006.01)
(52) U.S. Cl.
CPC ..... *H03D 7/1458* (2013.01); *H01L 29/78648* (2013.01); *H01L 29/7869* (2013.01)
(58) Field of Classification Search
None
See application file for complete search history.

(56) References Cited

U.S. PATENT DOCUMENTS 6,982,588 B1 * 1/2006 Lin .................. H03D 7/1441
455/333
7,450,913 B2 * 11/2008 Friedrich ............ H03D 7/1491
455/127.1

(Continued)

FOREIGN PATENT DOCUMENTS

CN   101611542 A    12/2009
CN   107078031 A     8/2017

(Continued)

OTHER PUBLICATIONS

International Search Report (Application No. PCT/IB2021/053880) dated Jul. 27, 2021.

(Continued)

*Primary Examiner* — Jeffrey S Zweizig
(74) *Attorney, Agent, or Firm* — Husch Blackwell LLP

(57) ABSTRACT

A novel semiconductor device is provided. The semiconductor device includes a mixer circuit and a bias circuit. The mixer circuit includes a voltage-to-current conversion portion, a current switch portion, and a current-to-voltage conversion portion. The bias circuit includes a bias supply portion and a first transistor. The voltage-to-current conversion portion includes a second transistor and a third transistor. The bias supply portion has a function of outputting a bias voltage to be supplied to a gate of the second transistor and a gate of the third transistor. One of a source and a drain of the first transistor is electrically connected to the gate of the second transistor and the gate of the third transistor. The first transistor is turned off when the bias voltage is supplied, and the first transistor is turned on when the supply of the bias voltage is stopped.

8 Claims, 22 Drawing Sheets

(56) References Cited

U.S. PATENT DOCUMENTS

| | | | |
|---|---|---|---|
| 7,973,587 B2* | 7/2011 | Yang | H03D 7/1491 |
| | | | 330/252 |
| 8,773,906 B2 | 7/2014 | Ohmaru | |
| 9,202,567 B2 | 12/2015 | Ohmaru | |
| 9,438,206 B2 | 9/2016 | Maehashi et al. | |
| 11,035,034 B2 | 6/2021 | Daigo et al. | |
| 2012/0195122 A1 | 8/2012 | Ohmaru | |
| 2015/0061742 A1 | 3/2015 | Maehashi et al. | |
| 2017/0040344 A1 | 2/2017 | Fujita | |
| 2017/0145588 A1 | 5/2017 | Daigo et al. | |
| 2017/0154560 A1 | 6/2017 | Takahashi | |
| 2018/0226034 A1 | 8/2018 | Takahashi | |
| 2019/0362668 A1 | 11/2019 | Takahashi | |
| 2019/0371249 A1 | 12/2019 | Takahashi | |
| 2022/0216830 A1* | 7/2022 | Ohshima | H01L 27/0688 |
| 2022/0246615 A1 | 8/2022 | Ohshima et al. | |
| 2022/0286090 A1 | 9/2022 | Kimura et al. | |

FOREIGN PATENT DOCUMENTS

| | | | |
|---|---|---|---|
| JP | 2003-283252 A | | 10/2003 |
| JP | 2006-314029 A | | 11/2006 |
| JP | 2008-141452 A | | 6/2008 |
| JP | 2009-164704 A | | 7/2009 |
| JP | 2010-220034 A | | 9/2010 |
| JP | 2015-100078 A | | 5/2015 |
| JP | 2019-195028 A | | 11/2019 |
| KR | 2017-0034905 A | | 3/2017 |
| WO | WO 2008/066208 A1 | | 6/2008 |
| WO | WO 2016/017047 A1 | | 2/2016 |

OTHER PUBLICATIONS

Written Opinion (Application No. PCT/IB2021/053880) dated Jul. 27, 2021.

Yamazaki, S. et al., "Properties of Crystalline In—Ga—Zn-oxide Semiconductor and its Transistor Characteristics," Japanese Journal of Applied Physics, Mar. 31, 2014, vol. 53, No. 4S, pp. 04ED18-1-04ED18-10.

Yamazaki, S. et al., "Research, Development, and Application of Crystalline Oxide Semiconductor," SID Digest '12: SID International Symposium Digest of Technical Papers, Jun. 5, 2012, vol. 43, No. 1, pp. 183-186.

Matsuzawa, A. "Advanced Design Technology Trends in Analog and RF Circuits Part 2," Hibikino Semiconductor Academy Lecture "Advanced Design Technology Trends in Analog and RF Circuits," Jul. 3, 2008, pp. 1-59, IEEJ Kyushu Branch.

* cited by examiner

FIG. 16A
Intermediate state
New crystalline phase
| Amorphous | Crystalline | Crystal |
|---|---|---|
| •completely amorphous | •CAAC<br>•nc<br>•CAC<br>excluding single crystal and poly crystal | •single crystal<br>•poly crystal |
FIG. 16B
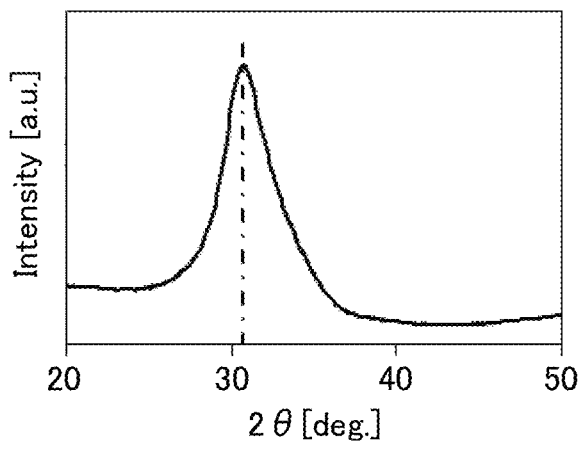
FIG. 16C
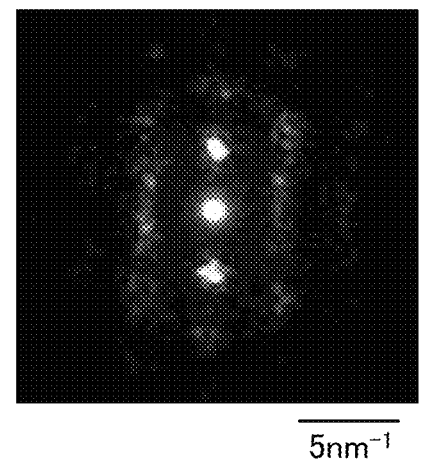

SEMICONDUCTOR DEVICE

This application is a 371 of international application PCT/IB2021/053880 filed on May 7, 2021 which is incorporated herein by reference.

TECHNICAL FIELD

One embodiment of the present invention relates to a semiconductor device.

The technical field of the invention disclosed in this specification and the like relates to an object, a method, or a manufacturing method. Alternatively, one embodiment of the present invention relates to a process, a machine, manufacture, or a composition of matter.

Specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, or a testing method thereof. Note that one embodiment of the present invention is not limited to the above technical field.

In this specification and the like, a semiconductor device generally means a device that can function by utilizing semiconductor characteristics. Thus, a semiconductor element such as a transistor or a diode and a circuit including a semiconductor element are semiconductor devices. In addition, a display device, a light-emitting device, a lighting device, an electro-optical device, an imaging device, a communication device, an electronic device, or the like may include a semiconductor element or a semiconductor circuit. Therefore, a display device, a light-emitting device, a lighting device, an electro-optical device, an imaging device, a communication device, an electronic device, and the like are referred to as a semiconductor device in some cases.

BACKGROUND ART

With the development of information technology such as IoT (Internet of Things), the amount of data handled in information terminals has been recently showing an increasing tendency. Thus, transmission speed of not only base stations but also electronic devices such as information terminals needs to be improved. In order to be compatible with various kinds of information technology such as IoT, a new communication standard called the fifth-generation mobile communication system (5G) that achieves more simultaneous connections and shorter delay time has been examined.

In order to be compatible with 5G, what is called a wide-gap semiconductor such as SiC (silicon carbide) or GaN (gallium nitride) has been developed rapidly for the realization of an electronic device that has high output and can operate at high speed. A 5G compatible semiconductor device is manufactured using a semiconductor containing one kind of element such as Si as its main component or a compound semiconductor containing a plurality of kinds of elements such as Ga and As as its main components. Furthermore, an oxide semiconductor, which is one kind of metal oxide, has attracted attention.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

Improvement of communication speed tends to increase power consumption. Thus, electronic devices such as information terminals need to improve communication speed and reduce power consumption. For example, an RF (Radio Frequency) circuit used for data communication is required to operate at high speed, and thus generally has large power consumption. In particular, in the RF circuit, a reduction in standby power (power consumed in a non-communication state (standby state)) is required.

An object of one embodiment of the present invention is to provide a semiconductor device or the like with reduced power consumption. Another object is to provide a semiconductor device or the like with high reliability. Another object is to provide a semiconductor device or the like with high productivity. Another object is to provide a novel semiconductor device or the like.

Note that the description of these objects does not preclude the existence of other objects. In one embodiment of the present invention, there is no need to achieve all the objects. Note that other objects will be apparent from the descriptions of the specification, the drawings, the claims, and the like, and other objects can be derived from the descriptions of the specification, the drawings, the claims, and the like.

Means for Solving the Problems

One embodiment of the present invention is a semiconductor device including a mixer circuit and a bias circuit. The mixer circuit includes a voltage-to-current conversion portion, a current switch portion, and a current-to-voltage conversion portion. The bias circuit includes a bias supply portion and a first transistor. The voltage-to-current conversion portion includes a second transistor and a third transistor. The bias circuit has a function of outputting a bias voltage to be supplied to a gate of the second transistor and a gate of the third transistor. One of a source and a drain of the first transistor is electrically connected to the gate of the second transistor and the gate of the third transistor.

The bias circuit may include a voltage holding portion electrically connected to the bias supply portion, and a buffer portion electrically connected to the voltage holding portion. An output of the buffer portion is electrically connected to the gate of the second transistor and the gate of the third transistor. The voltage holding portion has a function of holding the bias voltage. The buffer portion has a function of amplifying power of the bias voltage.

The first transistor is preferably a transistor including an oxide semiconductor in a channel formation region. The voltage holding portion includes a fourth transistor. The fourth transistor is preferably a transistor including an oxide semiconductor in a channel formation region. The oxide semiconductor preferably contains at least one of indium and zinc. The second transistor and the third transistor are each preferably a transistor including a nitride semiconductor in a channel formation region. As the nitride semiconductor, a semiconductor containing gallium can be given, for example.

The semiconductor device of one embodiment of the present invention can turn off the first transistor when the bias voltage is supplied and turn on the first transistor when the supply of the bias voltage is stopped.

Effect of the Invention

According to one embodiment of the present invention, a semiconductor device or the like with reduced power consumption can be provided. A semiconductor device or the like with high reliability can be provided. A semiconductor device or the like with high productivity can be provided. A novel semiconductor device or the like can be provided.

Note that the description of these effects does not preclude the existence of other effects. One embodiment of the present invention does not have to have all these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIG. 16A is a diagram showing the classification of crystal structures of IGZO. FIG. 16B is a graph showing an XRD spectrum of a CAAC-IGZO film. FIG. 16C is an image showing nanobeam electron diffraction patterns of a CAAC-IGZO film.

MODE FOR CARRYING OUT THE INVENTION

Figure 1:
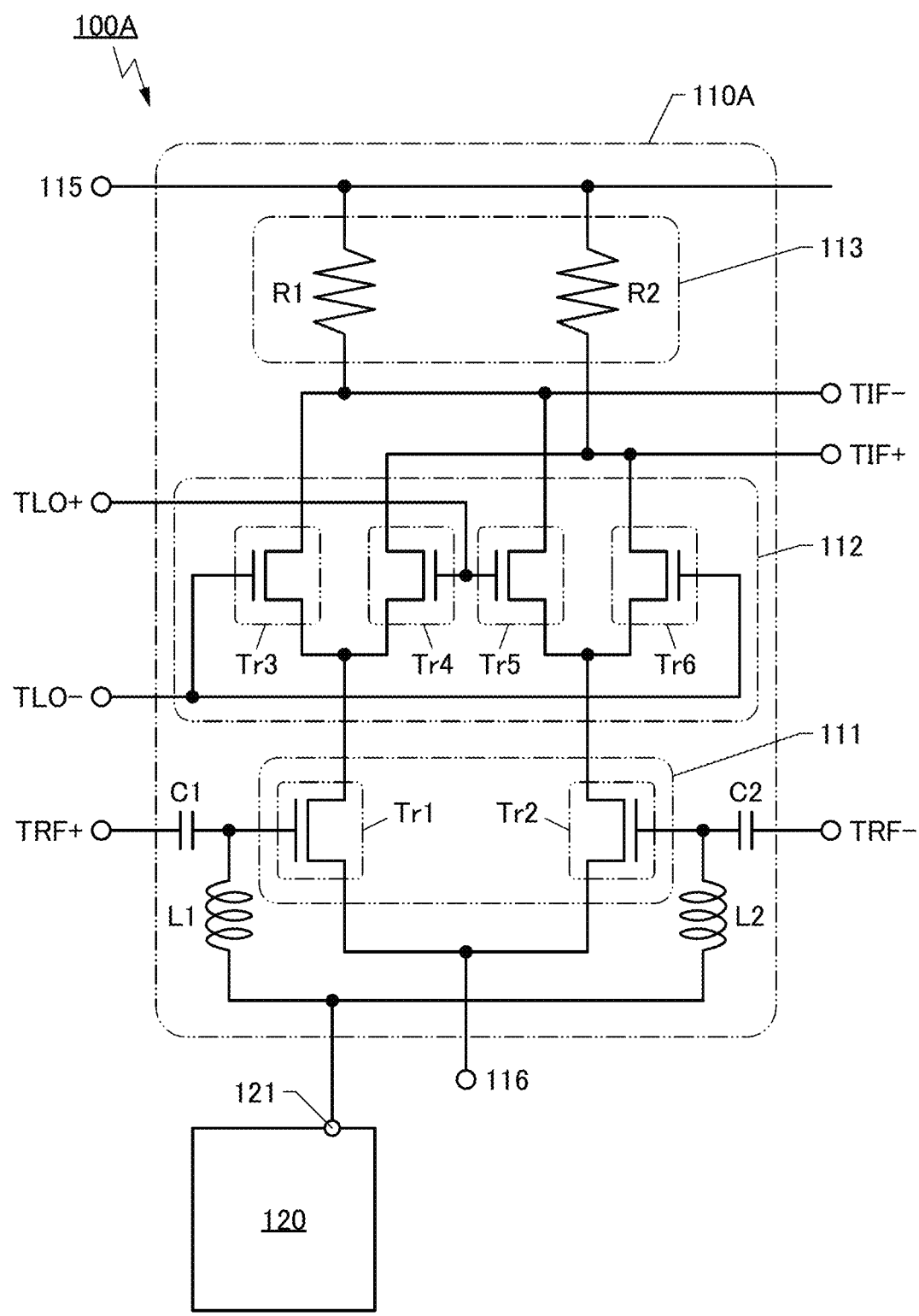
FIG. 1 is a diagram illustrating a semiconductor device of one embodiment of the present invention.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves may be semiconductor devices or may each include a semiconductor device.

When this specification and the like state that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display device, a light-emitting device, or a load) can be connected between X and Y. Note that a switch has a function of being controlled to be in an on state or an off state. That is, a switch has a function of being in a conduction state (on state) or a non-conduction state (off state) to control whether or not current flows.

For example, in the case where X and Y are functionally connected, one or more circuits that enable functional connection between X and Y (e.g., a logic circuit (an inverter, a NAND circuit, a NOR circuit, or the like), a signal converter circuit (a digital-to-analog converter circuit, an analog-to-digital converter circuit, a gamma correction circuit, or the like), a potential level converter circuit (a power supply circuit (e.g., a step-up circuit or a step-down circuit), a level shifter circuit for changing the potential level of a signal, or the like), a voltage source, a current source, a switching circuit, an amplifier circuit (a circuit that can increase the signal amplitude, the amount of current, or the like, an operational amplifier, a differential amplifier circuit, a source follower circuit, a buffer circuit, or the like), a signal generation circuit, a memory circuit, or a control circuit) can be connected between X and Y. For instance, even if another circuit is provided between X and Y, X and Y are regarded as being functionally connected when a signal output from X is transmitted to Y.

Note that an explicit description, X and Y are electrically connected, includes the case where X and Y are electrically connected (i.e., the case where X and Y are connected with another element or another circuit provided therebetween) and the case where X and Y are directly connected (i.e., the case where X and Y are connected without another element or another circuit provided therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor" can be, for example, a circuit element or a wiring having a resistance value higher than 0Ω. Therefore, in this specification and the like, a "resistor" sometimes includes a wiring having a resistance value, a transistor in which current flows between its source and drain, a diode, and an inductor. Thus, the term "resistor" can be replaced with the terms "resistance", "load", "region having a resistance value", and the like; conversely, the terms "resistance", "load", and "region having a resistance value" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to 1×10$^9$Ω.

In this specification and the like, a "capacitor" can be, for example, a circuit element having an electrostatic capacitance value higher than 0 F, a region of a wiring having an electrostatic capacitance value, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "a pair of electrodes" of a "capacitor" can be replaced with "a pair of conductors", "a pair of conductive regions", "a pair of regions", and the like. Note that the electrostatic capacitance value can be greater than or equal to 0.05 fF and less than or equal to 10 pF, for example. For another example, the electrostatic capacitance value may be greater than or equal to 1 pF and less than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used to describe the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, an "on state" of a transistor refers to a state in which a source and a drain of the transistor are regarded as being electrically short-circuited (also referred to as a "conduction state"). Furthermore, an "off state" of a transistor refers to a state in which a source and a drain of the transistor are regarded as being electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In addition, in this specification and the like, "node" can be referred to as a terminal, a wiring, an electrode, a conductive layer, a conductor, an impurity region, or the like depending on a circuit configuration, a device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, are changed with a change of the reference potential.

In this specification and the like, a high power supply potential VDD (hereinafter, also simply referred to as "VDD") is a power supply potential higher than a low power supply potential VSS (hereinafter, also simply referred to as "VSS"). VSS refers to a power supply potential at a potential lower than VDD. A ground potential (hereinafter, also simply referred to as "GND") can be used as VDD or VSS. For example, in the case where VDD is the ground potential, VSS is a potential lower than the ground potential, and in the case where VSS is the ground potential, VDD is a potential higher than the ground potential.

"Current" means a charge transfer phenomenon (electrical conduction); for example, the description "electrical conduction of positively charged particles is caused" can be rephrased as "electrical conduction of negatively charged particles is caused in the opposite direction". Therefore, unless otherwise specified, "current" in this specification and the like refers to a charge transfer phenomenon (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. For another example, the description "current is input to element A" can be rephrased as "current is output from element A".

Ordinal numbers such as "first", "second", and "third" in this specification and the like are used in order to avoid confusion among components. Thus, the terms do not limit the number of components. Furthermore, the terms do not limit the order of components. For example, a "first" component in one embodiment in this specification and the like can be referred to as a "second" component in other embodiments or the scope of claims. For another example, a "first" component in one embodiment in this specification and the like can be omitted in other embodiments or the scope of claims.

The term "over" or "under" does not necessarily mean that a component is placed directly on or directly under and directly in contact with another component. For example, the expression "electrode B over insulating layer A" does not necessarily mean that the electrode B is formed on and in direct contact with the insulating layer A, and does not exclude the case where another component is provided between the insulating layer A and the electrode B.

The positional relation between components changes as appropriate in accordance with the direction in which each component is described. Thus, the positional relation is not limited to that described with a term in this specification and the like and can be described with another term as appropriate depending on the situation. For example, in this specification and the like, terms for describing arrangement, such as "over" and "under", are sometimes used for convenience to describe the positional relation between components with reference to drawings. Accordingly, the expression "an insulator positioned over (on) a top surface of a conductor" can be replaced with the expression "an insulator positioned under (on) a bottom surface of a conductor" when the direction of a drawing showing these components is rotated by 180°. Moreover, the expression "an insulator positioned over (on) a top surface of a conductor" can be replaced with the expression "an insulator positioned on a left surface (or a right surface) of a conductor" when the direction of a drawing showing these components is rotated by 90°.

Similarly, the term "overlap", for example, in this specification and the like does not limit a state such as the stacking order of components. For example, the expression "electrode B overlapping with insulating layer A" does not necessarily mean the state where "electrode B is formed over insulating layer A", and does not exclude the state where "electrode B is formed under insulating layer A" and the state where "electrode B is formed on the right side (or the left side) of insulating layer A".

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the terms such as "film" and "layer" can be interchanged with each other depending on the situation. For example, the term "conductive layer" can be changed into the term "conductive film" in some cases. For another example, the term "insulating film" can be changed into the term "insulating layer" in some cases. Alternatively, the term "film", "layer", or the like is not used and can be interchanged with another term depending on the case or situation. For example, the term "conductive layer" or "conductive film" can be changed into the term "conductor" in some cases. For another example, the term "insulating layer" or "insulating film" can be changed into the term "insulator" in some cases.

In this specification and the like, the term "electrode", "wiring", "terminal", or the like does not limit the function of a component. For example, an "electrode" is sometimes used as part of a "wiring", and vice versa. Furthermore, the term "electrode" or "wiring" can also mean the case where a plurality of "electrodes" or "wirings" are formed in an integrated manner, for example. For another example, a "terminal" is sometimes used as part of a "wiring" or an "electrode", and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the terms "wiring", "signal line", "power supply line", and the like can be interchanged with each other depending on the case or situation. For example, the term "wiring" can be changed into the term "signal line" in some cases. For another example, the term "wiring" can be changed into the term "power supply line" in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or situation. Conversely, the term "signal" or the like can be changed into the term "potential" in some cases.

In this specification and the like, an impurity in a semiconductor refers to, for example, elements other than the main components of a semiconductor. For instance, an element with a concentration of lower than 0.1 atomic % is an impurity. When an impurity is contained, for example, the density of defect states in a semiconductor is increased, carrier mobility may be decreased, or crystallinity is decreased in some cases. When the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is silicon, examples of an impurity that changes characteristics of the semiconductor include oxygen, Group 1 elements except hydrogen, Group 2 elements, Group 13 elements, and Group 15 elements.

In this specification and the like, a switch has a function of controlling whether current flows or not by being in a conduction state (on state) or a non-conduction state (off state). Alternatively, a switch has a function of selecting and changing a current path. For example, an electrical switch or a mechanical switch can be used. That is, a switch can be any element capable of controlling current, and is not limited to a particular element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification and the like, "parallel" indicates a state where the angle formed between two straight lines is greater than or equal to −10° and less than or equal to 10°. Thus, the case where the angle is greater than or equal to −5° and less than or equal to 5° is also included. The term "approximately parallel" or "substantially parallel" indicates a state where the angle formed between two straight lines is greater than or equal to −30° and less than or equal to 30°. The term "perpendicular" indicates a state where the angle formed between two straight lines is greater than or equal to 80° and less than or equal to 100°. Thus, the case where the angle is greater than or equal to 85° and less than or equal to 95° is also included. The term "approximately perpendicular" or "substantially perpendicular" indicates a state where the angle formed between two straight lines is greater than or equal to 60° and less than or equal to 120°.

In this specification and the like, the terms "identical", "the same", "equal", "uniform", and the like used in describing calculation values and measurement values or in describing objects, methods, and the like that can be converted into calculation values or measurement values allow for a margin of error of ±20% unless otherwise specified.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, in the case where a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that content (or part of the content) described in one embodiment can be applied to, combined with, or replaced with at least one of another content (or part of the content) in the embodiment and content (or part of the content) described in one or a plurality of different embodiments.

Note that in each embodiment (or the example), content described in the embodiment is content described using a variety of diagrams or content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification will be described with reference to the drawings. Note that the embodiments can be implemented in many different modes, and it will be readily appreciated by those skilled in the art that the modes and details can be changed in various ways without departing from the spirit and scope thereof. Therefore, the present invention should not be construed as being limited to the description of the embodiments. Note that in the structures of the invention in the embodiments, the same portions or portions having similar functions are denoted by the same reference numerals in different drawings, and repeated description thereof is omitted in some cases. Moreover, some components may be omitted in a perspective view, a top view, and the like for easy understanding of the drawings.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

In the drawings or the like, the size, the layer thickness, or the region is exaggerated for clarity in some cases. Therefore, they are not limited to the illustrated size, aspect ratio, and the like. Note that the drawings schematically show ideal examples, and embodiments of the present invention are not limited to shapes or values shown in the drawings. For example, variation in signal, voltage, or current due to noise or variation in signal, voltage, or current due to difference in timing can be included.

In the drawings and the like, for easy understanding of the potentials of a wiring, an electrode, and the like, "H" representing an H potential or "L" representing an L potential is sometimes written near the wiring, the electrode, and the like. In addition, enclosed "H" or "L" is sometimes written near a wiring, an electrode, and the like whose potential changes. Moreover, a symbol "x" is sometimes written on a transistor in an off state.

In this specification and the like, when a plurality of components are denoted by the same reference numerals, and in particular need to be distinguished from each other, an identification sign such as "_1", "[n]", "[m,n]", or "a" is sometimes added to the reference numerals. For example, one of two wirings GL is referred to as a wiring GL[1] and the other is referred to as a wiring GL[2] in some cases.

Embodiment 1

A semiconductor device 100A of one embodiment of the present invention is described.
<Structure Example of Semiconductor Device 100A>
FIG. 1 illustrates a circuit diagram of the semiconductor device 100A of one embodiment of the present invention. The semiconductor device 100A includes a mixer circuit 110A and a bias circuit 120.

[Mixer Circuit 110A]

The mixer circuit 110A includes a voltage-to-current conversion portion 111, a current switch portion 112, and a current-to-voltage conversion portion 113. The mixer circuit 110A is a passive mixer circuit using a Gilbert cell (also referred to as a Gilbert circuit). The mixer circuit 110A is also a double-balanced mixer circuit.

The voltage-to-current conversion portion 111 includes a transistor Tr1 and a transistor Tr2. The current switch portion 112 includes a transistor Tr3, a transistor Tr4, a transistor Tr5, and a transistor Tr6. The current-to-voltage conversion portion 113 includes a resistor R1 and a resistor R2.

More specifically, one of a source and a drain of the transistor Tr1 and one of a source and a drain of the transistor Tr2 are electrically connected to a terminal 116. The other of the source and the drain of the transistor Tr1 is electrically connected to one of a source and a drain of the transistor Tr3. The other of the source and the drain of the transistor Tr2 is electrically connected to one of a source and a drain of the transistor Tr5. A gate of the transistor Tr1 is electrically connected to a terminal TRF+ through a capacitor C1. That is, one electrode of the capacitor C1 is electrically connected to the gate of the transistor Tr1, and the other electrode thereof is electrically connected to the terminal TRF+. A gate of the transistor Tr2 is electrically connected to a terminal TRF− through a capacitor C2. That is, one electrode of the capacitor C2 is electrically connected to the gate of the transistor Tr2, and the other electrode thereof is electrically connected to the terminal TRF−.

With the capacitor C1 provided between the terminal TRF+ and the gate of the transistor Tr1, a DC component is removed from an AC signal supplied to the terminal TRF+, and an AC component can be efficiently supplied to the gate of the transistor Tr1. Note that the capacitor C1 and the capacitor C2 are not necessarily provided. The capacitor C1 and the capacitor C2 are provided as needed.

Note that the transistor Tr1 and the transistor Tr2 are preferably transistors having the same electrical characteristics. In particular, the transistor Tr1 and the transistor Tr2 preferably have the same gate voltage at which transconductance (gm) is the largest. For example, it is preferable that the transistor Tr1 and the transistor Tr2 have the same channel length L and the transistor Tr1 and the transistor Tr2 have the same channel width W. Furthermore, the transistor Tr1 and the transistor Tr2 preferably have the same composition of the main components of the semiconductor where a channel is formed. It is also preferable that the crystallinity of the semiconductors be the same.

The other of the source and the drain of the transistor Tr3 and the other of the source and the drain of the transistor Tr5 are electrically connected to a terminal TIF−. One of a source and a drain of the transistor Tr4 is electrically connected to one of the source and the drain of the transistor Tr3. One of a source and a drain of the transistor Tr6 is electrically connected to one of the source and the drain of the transistor Tr5. The other of the source and the drain of the transistor Tr4 and the other of the source and the drain of the transistor Tr6 are electrically connected to a terminal TIF+. A gate of the transistor Tr3 and a gate of the transistor Tr6 are electrically connected to a terminal TLO−. A gate of the transistor Tr4 and a gate of the transistor Tr5 are electrically connected to a terminal TLO+.

Note that the transistor Tr3 to the transistor Tr6 are preferably transistors having the same electrical characteristics. For example, it is preferable that the transistor Tr3 to the transistor Tr6 have the same channel length L and the transistor Tr3 to the transistor Tr6 have the same channel width W. Furthermore, the transistor Tr3 to the transistor Tr6 preferably have the same composition of the main components of the semiconductor where a channel is formed. It is also preferable that the crystallinity of the semiconductors be equal to each other.

One end of the resistor R1 is electrically connected to the terminal TIF−, and the other end thereof is electrically connected to a terminal 115. One end of the resistor R2 is electrically connected to the terminal TIF+, and the other end thereof is electrically connected to the terminal 115. The terminal 115 is supplied with VDD, for example, and the terminal 116 is supplied with VSS, for example.

The mixer circuit 110A has a function of accumulating a signal RF having a frequency $f_1$ and a signal LO having a frequency $f_2$ to generate a signal IF containing frequency components of $f_1+f_2$ and $f_1-f_2$.

Figure 8A:
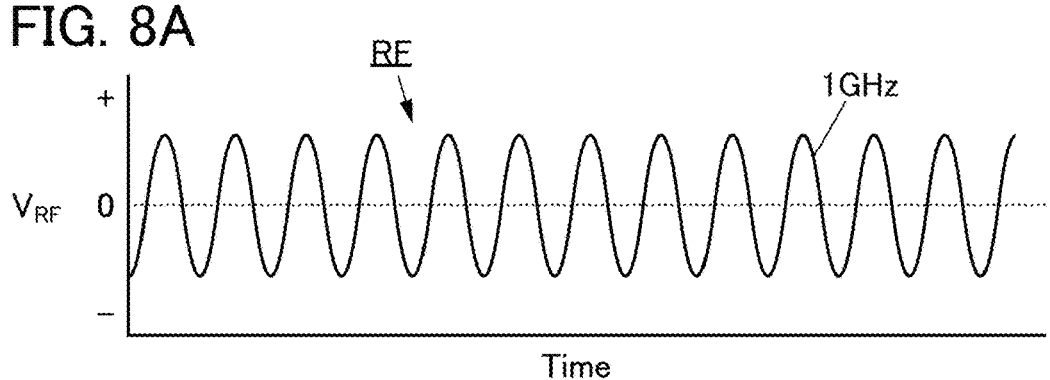
FIG. 8A to FIG. 8D are graphs showing a signal waveform of a signal RF.
Figure 8B:
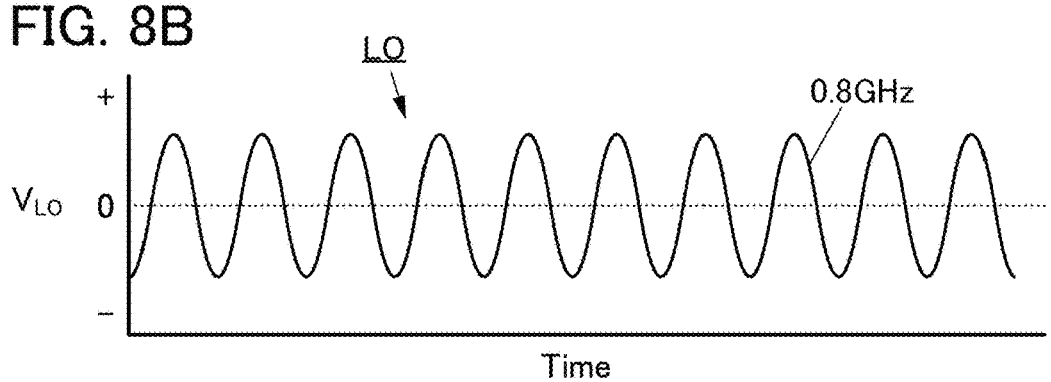
Figure 8C:
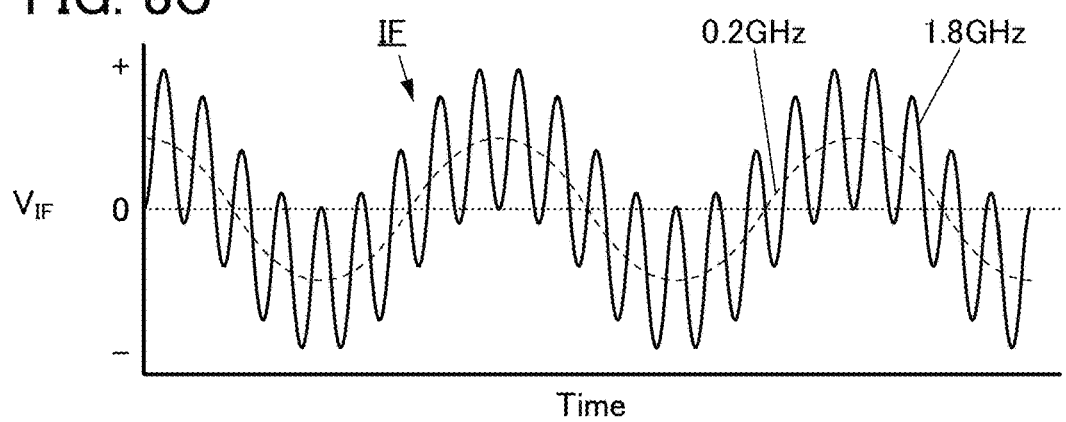

Here, first to third AC signals in the mixer circuit 110A are described. The frequency $f_1$ is preferably higher than the frequency $f_2$. In this embodiment, the frequency $f_1$ of the signal RF is a sine wave of 1 GHz, and the frequency $f_2$ of the second AC signal is a sine wave of 0.8 GHz. FIG. 8A shows a signal waveform of the signal RF. In FIG. 8A, the horizontal axis represents elapsed time (Time), and the vertical axis represents amplitude $V_{RF}$ of the signal RF. FIG. 8B shows a signal waveform of the second AC signal. In FIG. 8B, the horizontal axis represents elapsed time (Time), and the vertical axis represents amplitude $V_{LO}$ of the signal LO. FIG. 8C shows a signal waveform of the signal IF. In FIG. 8C, the horizontal axis represents elapsed time (Time), and the vertical axis represents amplitude $V_{IF}$ of the signal IF.

The signal RF is input to the terminal TRF+, and a signal obtained by phase inversion of the signal RF is input to the terminal TRF−. In addition, the signal LO is input to the terminal TLO+, and a signal obtained by phase inversion of the signal LO is input to the terminal TLO−.

In the voltage-to-current conversion portion 111, a current Id1 flowing between the source and the drain of the transistor Tr1 and a current Id2 flowing between the source and the drain of the transistor Tr2 are changed in accordance with the frequency $f_1$ of the signal RF input through the terminal TRF+ and the terminal TRF−.

The current switch portion 112 has a function of controlling the value of a current flowing between the terminal 115 and the terminal 116 in accordance with the signal LO. For example, the current switch portion 112 has a function of increasing or decreasing the current values of the current Id1 and the current Id2 in accordance with the frequency $f_2$ of the signal LO.

The change in the current values of the current Id1 and the current Id2 made by the current switch portion 112 corresponds to a multiplication result of the signal RF and the signal LO.

The multiplication result (current changes of the current Id1 and the current Id2) is converted into a voltage change by the current-to-voltage conversion portion 113 and output as the signal IF from each of the terminal TIF+ and the terminal TIF−. Note that the signal IF output from the terminal TIF− is a signal obtained by phase inversion of the signal IF output from the terminal TIF+.

As shown in FIG. 8C, the signal IF is a signal containing a frequency component (0.2 GHz) obtained by subtracting the frequency $f_2$ from the frequency $f_1$ ($f_1-f_2$) and a frequency component (1.8 GHz) obtained by adding the frequency $f_2$ to the frequency $f_1$ ($f_1+f_2$). For example, the signal IF can be converted into an AC signal of 1.8 GHz by passing through a high pass filter through which an AC signal of 0.2 GHz cannot pass but the AC signal of 1.8 GHz can pass. Similarly, the signal IF can be converted into the AC signal of 0.2 GHz by passing through a low pass filter through which the AC signal of 1.8 GHz cannot pass but the AC signal of 0.2 GHz can pass.

Figure 8D:
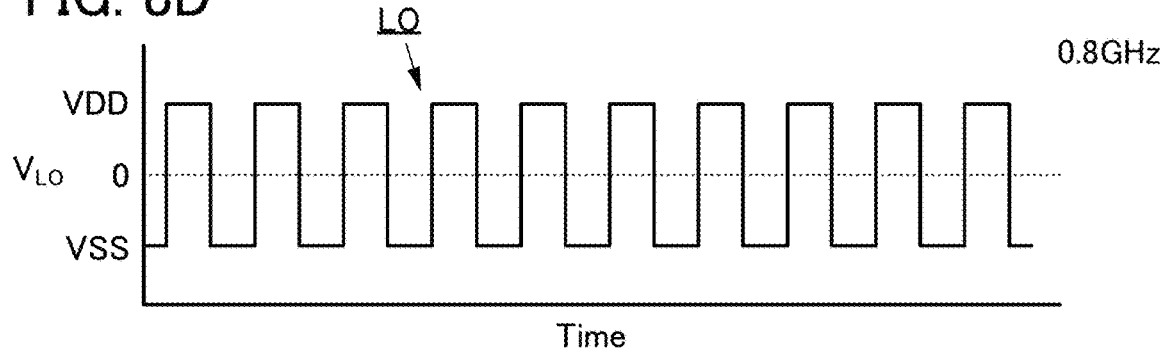

Note that the current switch portion 112 controls flowing and blocking of the current Id1 and the current Id2 in accordance with the frequency $f_2$. Thus, the signal LO is not necessarily a sine wave. The signal LO may be a rectangular wave in which VDD and VSS are switched in accordance with the frequency $f_2$ (see FIG. 8D).

Note that when a sine wave is used as the signal LO, a capacitor is preferably provided between the terminal TLO+ and the gate of the transistor Tr4 and the gate of the transistor Try. Similarly, a capacitor is preferably provided between the terminal TLO− and the gate of the transistor Tr3 and the gate of the transistor Tr6.

[Bias Circuit 120]

The bias circuit 120 is electrically connected to the mixer circuit 110A through a terminal 121. The bias circuit 120 has a function of supplying a DC voltage for bringing the transistor Tr1 and the transistor Tr2 included in the voltage-to-current conversion portion 111 into an on state.

Specifically, the terminal 121 is electrically connected to the gate of the transistor Tr1 through an inductor L1. That is, an end of the inductor L1 is electrically connected to the terminal 121, and the other end thereof is electrically connected to the gate of the transistor Tr1. The terminal 121 is electrically connected to the gate of the transistor Tr2 through an inductor L2. That is, an end of the inductor L2 is electrically connected to the terminal 121, and the other end thereof is electrically connected to the gate of the transistor Tr2.

Providing the inductor L1 and the inductor L2 can reduce an AC component such as noise contained in the voltage supplied from the bias circuit 120. Accordingly, the semiconductor device 100A can be operated stably and the semiconductor device 100A can have higher reliability. Note that the inductor L1 and the inductor L2 are not necessarily provided. The inductor L1 and the inductor L2 may be provided as needed.

In order to operate the voltage-to-current conversion portion 111 efficiently, the voltage supplied from the bias circuit 120 to the voltage-to-current conversion portion 111 is preferably a voltage at which gm of the transistor Tr1 and the transistor Tr2 is the maximum or the vicinity of the maximum.

Figure 2A:
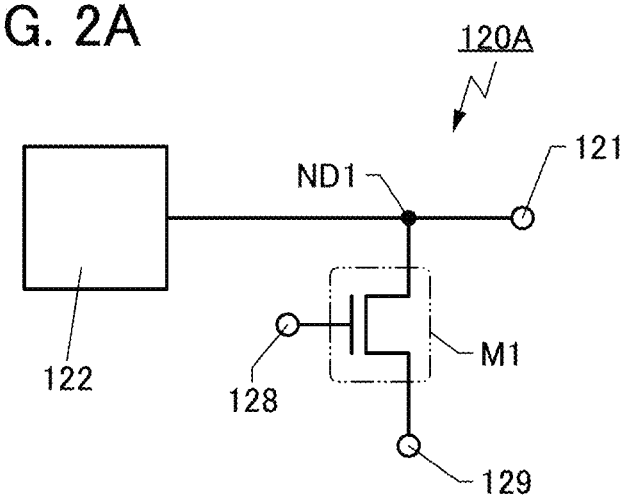
FIG. 2A to FIG. 2C are diagrams illustrating a semiconductor device of one embodiment of the present invention.

FIG. 2A illustrates a circuit configuration of a bias circuit 120A that can be used as the bias circuit 120. The bias circuit 120A includes a bias supply portion 122 and a transistor M1. The bias supply portion 122 is electrically connected to the terminal 121. One of a source and a drain of the transistor M1 is electrically connected to the terminal 121, and the other thereof is electrically connected to a terminal 129. A gate of the transistor M1 is electrically connected to a terminal 128. A node to which the bias supply portion 122, the terminal 121, and one of the source and the drain of the transistor M1 are electrically connected functions as a node ND1.

Figure 2B:
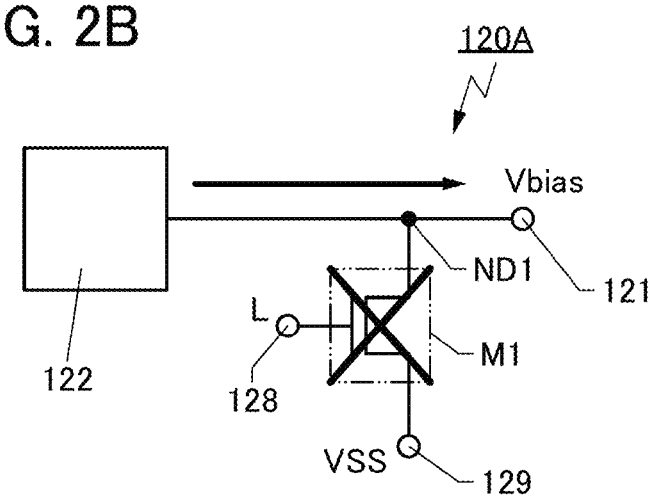

The terminal 129 is supplied with VSS, for example. A potential that brings the transistor M1 into an on state or an off state is supplied to the terminal 128. In an operation period of the semiconductor device 100A, a potential (L potential) that brings the transistor M1 into an off state is supplied to the terminal 128 to turn off the transistor M1. A bias voltage Vbias is supplied from the bias supply portion 122 to the terminal 121 (see FIG. 2B).

Figure 2C:
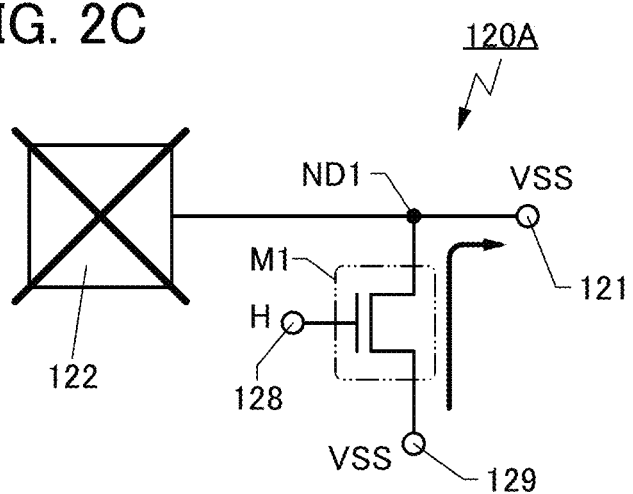

In a stopping period of the semiconductor device 100A, power supply to the bias supply portion 122 is stopped. Thus, the supply of the bias voltage Vbias to the terminal 121 is stopped. A potential (H potential) that brings the transistor M1 into an on state is supplied to the terminal 128 to turn on the transistor M1. Accordingly, electrical continuity is established between the terminal 121 and the terminal 129, so that VSS is supplied to the terminal 121 (see FIG. 2C).

The bias voltage Vbias remains in the node ND1 by only stopping the supply of the bias voltage Vbias from the bias supply portion 122. Thus, the operation of the mixer circuit 110A cannot be stopped or cannot be stopped quickly, in some cases. Like in the bias circuit 120A, providing the transistor M1 can change the potential of the node ND1 to VSS quickly. Accordingly, the semiconductor device 100A can be brought into a stopping state quickly, so that power consumption of the semiconductor device 100A can be reduced.

Figure 3A:
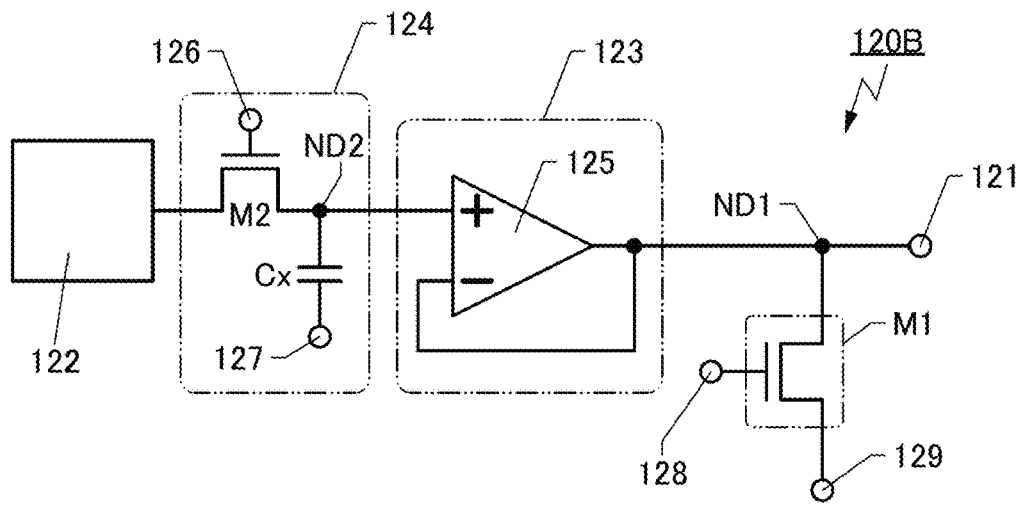
FIG. 3A to FIG. 3C are diagrams illustrating a semiconductor device of one embodiment of the present invention.

FIG. 3A illustrates a circuit configuration of a bias circuit 120B that can be used as the bias circuit 120. The bias circuit 120B includes a voltage holding portion 124 and a buffer portion 123 in addition to the components of the bias circuit 120A. The voltage holding portion 124 includes a transistor M2 and a capacitor Cx. The buffer portion 123 includes an operational amplifier 125.

In the bias circuit 120B, the bias supply portion 122 is electrically connected to one of a source and a drain of the transistor M2. The other of the source and the drain of the transistor M2 is electrically connected to one electrode of the capacitor Cx. The other electrode of the capacitor Cx is electrically connected to a terminal 127.

The other of the source and the drain of the transistor M2 is electrically connected to a non-inverting input of the operational amplifier 125. An output terminal of the operational amplifier 125 is electrically connected to the terminal 121 and an inverting input of the operational amplifier 125. A node to which the output terminal of the operational amplifier 125, the terminal 121, and one of the source and the drain of the transistor M1 are electrically connected functions as the node ND1. A gate of the transistor M2 is electrically connected to a terminal 126. A node to which the other of the source and the drain of the transistor M2, one electrode of the capacitor Cx, and the non-inverting input of the operational amplifier 125 are electrically connected functions as a node ND2.

Like in the bias circuit 120A, the terminal 129 is supplied with VSS, for example. A potential for bringing the transistor M1 into an on state or an off state is supplied to the terminal 128, and a potential for bringing the transistor M2 into an on state or an off state is supplied to the terminal 126.

Figure 3B:
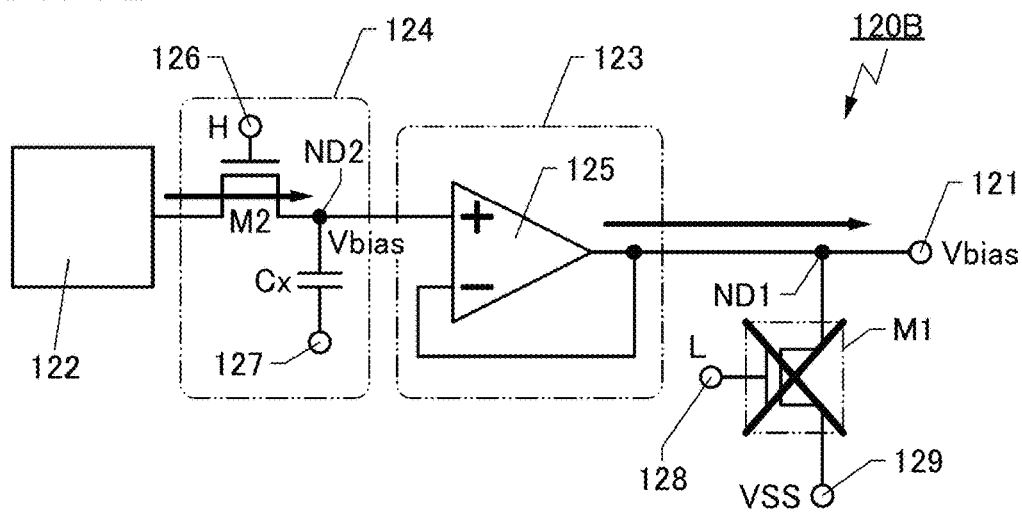

In an operation period of the semiconductor device 100A, an L potential is supplied to the terminal 128 to turn off the transistor M1. After the start of the operation, the bias voltage Vbias is supplied from the bias supply portion 122 to the node ND2 (see FIG. 3B). Thus, the bias voltage Vbias is supplied to the non-inverting input of the operational amplifier 125, and the bias voltage Vbias is output from the output of the operational amplifier 125. The operational amplifier 125 included in the bias circuit 120A has a function of amplifying power without changing the voltage of the signal supplied to the non-inverting input. Thus, the buffer portion 123 has a function of amplifying the power of the bias voltage Vbias. The bias voltage Vbias obtained by power amplification by the buffer portion 123 is supplied to the node ND1 and the terminal 121.

Figure 3C:
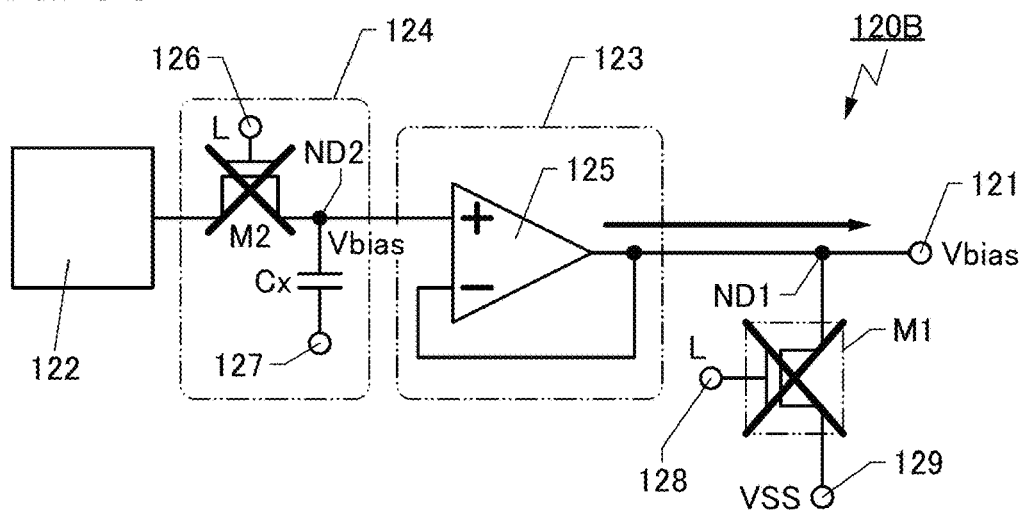

After the bias voltage Vbias is supplied to the node ND2, an L potential is supplied to the terminal 126 to turn off the transistor M2 (see FIG. 3C). As a result, the bias voltage Vbias is held in the node ND2. Thus, the voltage holding portion 124 functions as a memory circuit. When the voltage holding portion 124 holds the bias voltage Vbias, the bias supply portion 122 can supply various potentials to other circuits. Furthermore, when the voltage holding portion 124 holds the bias voltage Vbias, the bias supply portion 122 can be stopped in an operation period of the semiconductor device 100A. Thus, the power consumption of the semiconductor device 100A can be reduced.

Figure 4:
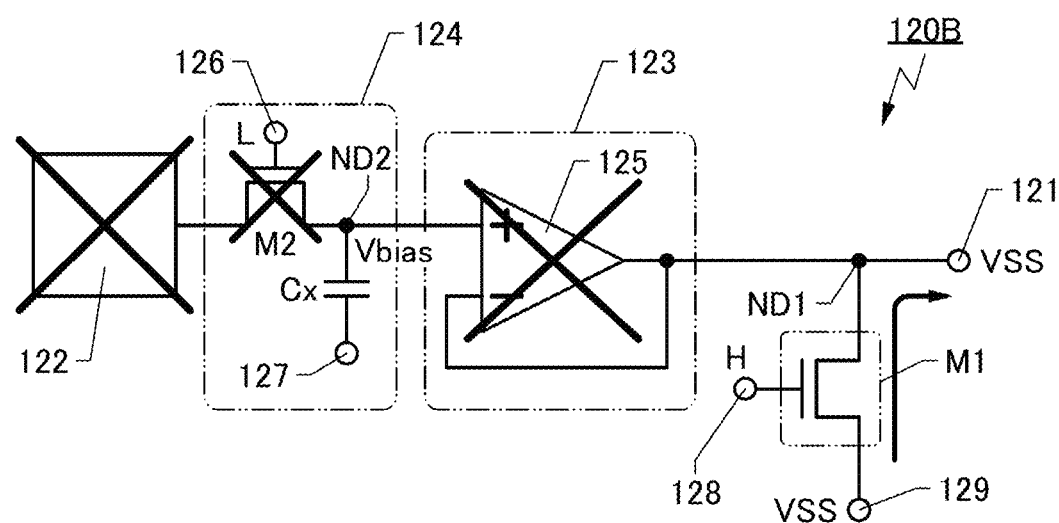
FIG. 4 is a diagram illustrating a semiconductor device of one embodiment of the present invention.

In the stopping period of the semiconductor device 100A, power supply to the bias supply portion 122 and the operational amplifier 125 is stopped. An H potential is supplied to the terminal 128 to turn on the transistor M1. Accordingly, electrical continuity is established between the terminal 121 and the terminal 129, so that VSS is supplied to the terminal 121 (see FIG. 4).

The transistor M1 in the bias circuit 120B functions in a manner similar to that in the bias circuit 120A. When the transistor M1 is provided, the semiconductor device 100A can be brought into a stopping state quickly, so that power consumption can be reduced.

By providing the voltage holding portion 124, the bias voltage Vbias can be held in the voltage holding portion 124 even in the stopping period of the semiconductor device 100A. For this reason, there is no need to wait bias supply from the bias supply portion 122 when the semiconductor device 100A is returned. Thus, a returning operation of the semiconductor device 100A can be performed quickly.

As each of the transistor M1 and the transistor M2, it is preferable to use a transistor including an oxide semiconductor, which is a kind of metal oxide, in a semiconductor where a channel is formed (also referred to as an "OS transistor" or an "OS-FET"). An OS transistor is a transistor having an extremely low off-state current. When an OS transistor is used as the transistor M1, leakage current between the node ND1 and the terminal 129 in the operation of the semiconductor device 100A can be significantly reduced. In other words, the leakage current can be substantially eliminated. In addition, the use of an OS transistor as the transistor M2 enables the potential of the node ND2 to be held for a long period.

As described above, the voltage holding portion 124 functions as a memory circuit. In particular, in the case where an OS transistor is used as the transistor M2, the voltage holding portion 124 can be referred to as an "OS memory".

An OS memory can retain written data for a period of one year or longer, or 10 years or longer even after power supply is stopped. Thus, the OS memory can be regarded as a nonvolatile memory.

An OS memory employs a method in which charge is written to a node through the OS transistor; hence, a high voltage, which a conventional flash memory requires, is unnecessary and a high-speed writing operation is possible. Furthermore, the OS memory does not conduct charge injection and extraction to and from a floating gate or a charge-trap layer, substantially allowing an unlimited number of times of data writing and reading. An OS memory is less likely to degrade than a conventional flash memory and can have high reliability.

Unlike a magnetic memory, a resistive random access memory, or the like, an OS memory has no change in the structure at the atomic level. Thus, an OS memory has higher rewrite endurance than a magnetic memory and a resistive random access memory.

Figure 5A:
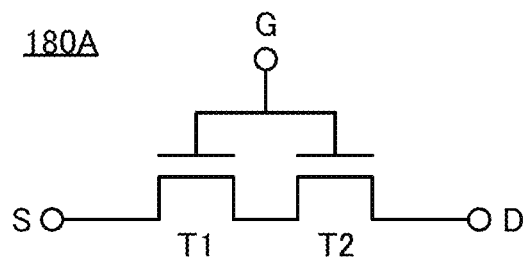
FIG. 5A to FIG. 5D are diagrams illustrating circuit symbols of transistors.

The transistors Tr1 to Tr6, the transistor M1, and the transistor M2 may each be a double-gate transistor. FIG. 5A illustrates a circuit symbol example of a double-gate transistor 180A.

The transistor 180A has a structure in which a transistor T1 and a transistor T2 are connected in series. FIG. 5A illustrates a state in which one of a source and a drain of the transistor T1 is electrically connected to a terminal S, the other of the source and the drain of the transistor T1 is electrically connected to one of a source and a drain of the transistor T2, and the other of the source and the drain of the transistor T2 is electrically connected to a terminal D. FIG. 5A illustrates a state in which gates of the transistor T1 and the transistor T2 are electrically connected to each other and electrically connected to a terminal G.

The transistor 180A illustrated in FIG. 5A has a function of switching a conduction state and a non-conduction state between the terminal S and the terminal D by changing the potential of the terminal G. Thus, the transistor 180A which is a double-gate transistor functions as one transistor including the transistor T1 and the transistor T2. In other words, it can be said that in FIG. 5A, one of a source and a drain of the transistor 180A is electrically connected to the terminal S, the other of the source and the drain thereof is electrically connected to the terminal D, and a gate thereof is electrically connected to the terminal G.

Figure 5B:
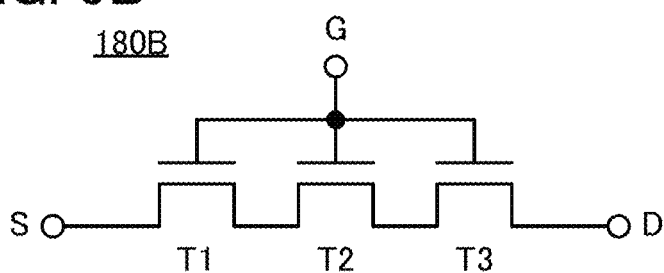

The transistors Tr1 to Tr6, the transistor M1, and the transistor M2 may each be a triple-gate transistor. FIG. 5B illustrates a circuit symbol example of a triple-gate transistor 180B.

The transistor 180B has a structure in which the transistor T1, the transistor T2, and a transistor T3 are connected in series. FIG. 5B illustrates a state in which the one of the source and the drain of the transistor T1 is electrically connected to the terminal S, the other of the source and the drain of the transistor T1 is electrically connected to the one of the source and the drain of the transistor T2, the other of the source and the drain of the transistor T2 is electrically connected to one of a source and a drain of the transistor T3, and the other of the source and the drain of the transistor T3 is electrically connected to the terminal D. FIG. 5B illustrates a state in which gates of the transistor T1, the transistor T2, and the transistor T3 are electrically connected to each other and electrically connected to the terminal G.

The transistor 180B illustrated in FIG. 5B has a function of switching a conduction state and a non-conduction state between the terminal S and the terminal D by changing the potential of the terminal G. Thus, the transistor 180B which is a triple-gate transistor functions as one transistor including the transistor T1, the transistor T2, and the transistor T3. In other words, it can be said that in FIG. 5B, one of a source and a drain of the transistor 180B is electrically connected to the terminal S, the other of the source and the drain thereof is electrically connected to the terminal D, and a gate thereof is electrically connected to the terminal G.

Like the transistor 180A and the transistor 180B, a transistor including a plurality of gates electrically connected to each other is referred to as a "multi-gate type transistor" or a "multi-gate transistor" in some cases.

Figure 5C:
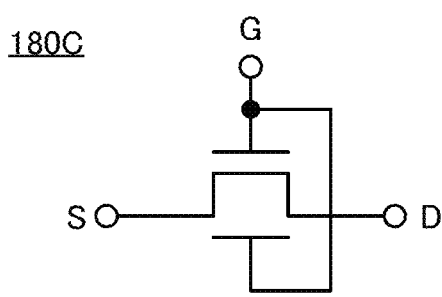
Figure 5D:
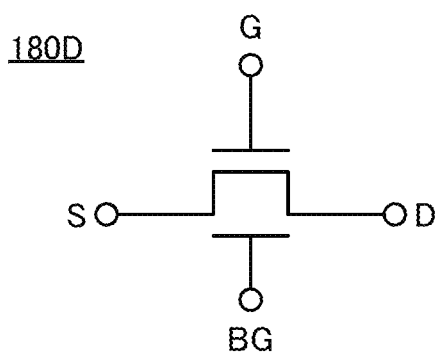

The transistors Tr1 to Tr6, the transistor M1, and the transistor M2 may each be a transistor including a back gate. FIG. 5C illustrates a circuit symbol example of a transistor 180C including a back gate. In the transistor 180C, since a gate and a back gate are electrically connected to each other, the gate and the back gate always have the same potential. FIG. 5D illustrates a circuit symbol example of a transistor 180D including a back gate.

In the transistor 180D, the back gate is electrically connected to a terminal BG. Accordingly, the same potential or different potentials can be supplied to the gate and the back gate.

The back gate is positioned so that a channel formation region of a semiconductor is sandwiched between the gate and the back gate. The back gate can function like the gate. The potential of the back gate may be the same as the potential of the gate or may be a ground potential (GND potential) or a given potential. By changing the potential of the back gate with no potential linkage between the gate and the back gate, the threshold voltage of the transistor can be changed.

In addition, the gate and the back gate are formed using conductor and thus also have a function of preventing an electric field generated outside the transistor from affecting the semiconductor where a channel is formed (particularly, a function of preventing static electricity). That is, a variation in the electrical characteristics of the transistor due to the influence of an external electric field such as static electricity can be prevented.

<Semiconductor>

As the semiconductors in which the channels of the transistors Tr1 to Tr6, the transistor M1, the transistor M2, and the like are formed, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor may be used.

Alternatively, gallium arsenide, aluminum gallium arsenide, indium gallium arsenide, gallium nitride, indium phosphide, silicon germanium, or the like that can be used for a high electron mobility transistor (HEMT) may be used.

Note that semiconductors may be stacked. In the case of stacking semiconductors, semiconductors having different crystal states may be used or different semiconductor materials may be used.

As described above, it is particularly preferable to use OS transistors as the transistor M1 and the transistor M2. An oxide semiconductor has a band gap of 2 eV or more and thus has an extremely low off-state current. For example, the off-state current per micrometer in channel width at a source-drain voltage of 3.5 V and room temperature (25° C.) can be lower than $1\times10^{-20}$ A, lower than $1\times10^{-22}$ A, or lower than $1\times10^{-24}$ A.

The OS transistor has a higher heat resistance than a Si transistor (a transistor containing silicon in a semiconductor where a channel is formed), and thus deterioration or the like of transistor characteristics (e.g., field-effect mobility) due to temperature rise is less likely to occur. When OS transistors are used as the transistors included in the semiconductor device 100A, stable operation can be performed even in a high-temperature environment.

An oxide semiconductor used for an OS transistor is a Zn oxide, a Zn—Sn oxide, a Ga—Sn oxide, an In—Ga oxide, an In—Zn oxide, an In—M—Zn oxide (M is Ti, Ga, Y, Zr, La, Ce, Nd, Sn, or Hf), or the like. The use of an oxide semiconductor containing Ga as M for the OS transistor is particularly preferable because the electrical characteristics such as field-effect mobility of the transistor can be made excellent by adjusting a ratio of elements. In addition, an oxide containing indium (In) and zinc (Zn) may contain one or more kinds selected from aluminum (Al), gallium (Ga), yttrium (Y), copper (Cu), vanadium (V), beryllium (Be), boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like.

The oxide semiconductor has features in that the bandgap is wide, electrons are less likely to be excited, and the effective mass of a hole is large. Thus, an avalanche breakdown and the like are less likely to occur in some cases in an OS transistor than in a Si transistor. Therefore, for example, an OS transistor inhibits hot-carrier degradation or the like that is caused by avalanche breakdown. Since hot-carrier degradation can be inhibited, an OS transistor can be driven at a high drain voltage.

An OS transistor is an accumulation transistor in which electrons are majority carriers. Therefore, DIBL (Drain-Induced Barrier Lowering), which is one of short-channel effects, is less likely to occur in an OS transistor than in an inversion transistor having a pn junction (typically a Si transistor). In other words, an OS transistor has higher resistance against short-channel effects than a Si transistor.

Owning to its high resistance against short-channel effects, an OS transistor can have a reduced channel length without deterioration in reliability. Accordingly, the use of an OS transistor can increase the integration degree of a circuit. Although a reduction in channel length due to miniaturization enhances a drain electric field, avalanche breakdown is less likely to occur in an OS transistor than in a Si transistor as described above.

Since an OS transistor has a high resistance against short-channel effects, a gate insulating film can be made thicker than that of a Si transistor. For example, even in a minute transistor whose channel length and channel width are less than or equal to 50 nm, a gate insulating film as thick as approximately 10 nm can be provided in some cases. When the gate insulating film is made thick, parasitic capacitance can be reduced and thus the operating speed of a circuit can be improved. In addition, when the gate insulating film is made thick, leakage current through the gate insulating film is reduced, resulting in a reduction in current consumption.

Note that an oxide semiconductor will be described in detail in Embodiment 5 and the like.

A high-frequency signal is input to the voltage-to-current conversion portion 111. Thus, as the transistor Tr1 and the transistor Tr2, a transistor using a nitride semiconductor containing a Group 13 element (e.g., gallium) in a semiconductor where a channel is formed is preferably used. For example, a transistor containing gallium nitride (also referred to as "GaN") in a semiconductor where a channel is formed (such a transistor is also referred to as "GaN transistor") can be given.

Note that the nitride semiconductor may be AlGaN or AlN. Alternatively, a transistor with high mobility including a material other than a nitride semiconductor may be used or a transistor containing SiC or the like in a semiconductor where a channel is formed may be used.

Alternatively, a semiconductor may be a stack of GaN and AlGaN. Aluminum nitride (AlN) has superior material characteristics of a band gap (6.2 eV) that is approximately 2 times the bandgap (3.4 V) of GaN, an electrostatic breakdown electric field (12 MV/cm) that is approximately 4 times the electrostatic breakdown electric field (3.3 MV/cm) of GaN, and a thermal conductivity (2.9 W/cmK) that is approximately 1.5 times the thermal conductivity (2 W/cmK) of GaN. AlGaN that is a mixed crystal of AlN and GaN is a preferable material for a high-output and high-frequency device. A HEMT whose channel formation region is AlGaN can operate with a higher breakdown voltage than a HEMT whose channel formation region is GaN. Note that two dimensional electron gas (2DEG) can be generated at an interface between GaN and AlGaN due to the polarization effect of GaN and AlGaN; thus, the transistor can be used as a transistor with high mobility.

Variation Example 1

Figure 6:
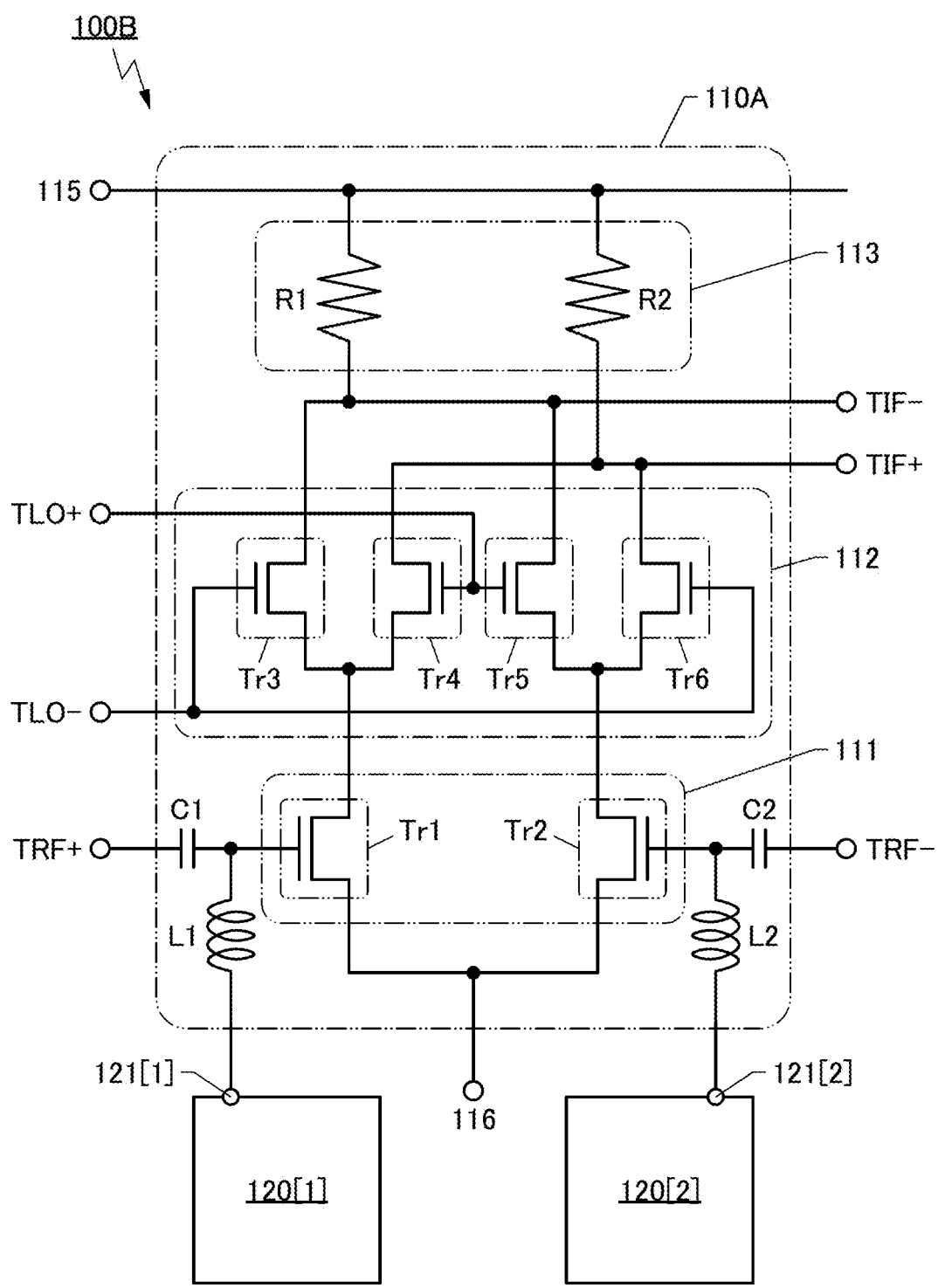
FIG. 6 is a diagram illustrating a semiconductor device of one embodiment of the present invention.

FIG. 6 illustrates a circuit diagram of a semiconductor device 100B of one embodiment of the present invention. The semiconductor device 100B is a variation example of the semiconductor device 100A. The semiconductor device 100B is different from the semiconductor device 100A in including the two bias circuits 120 (a bias circuit 120[1] and a bias circuit 120[2]).

The bias circuit 120[1] is electrically connected to the mixer circuit 110A through a terminal 121[1]. Specifically, the terminal 121[1] is electrically connected to the gate of the transistor Tr1 through the inductor L1. The bias circuit 120[2] is electrically connected to the mixer circuit 110A through the terminal 121. Specifically, the terminal 121[2] is electrically connected to the gate of the transistor Tr2 through the inductor L2.

With the provision of the bias circuit 120[1] and the bias circuit 120[2], when the maximum value of gm, for example, differs between the transistor Tr1 and the transistor Tr2, an optimum bias voltage Vbias can be supplied to each of them.

Variation Example 2

Figure 7:
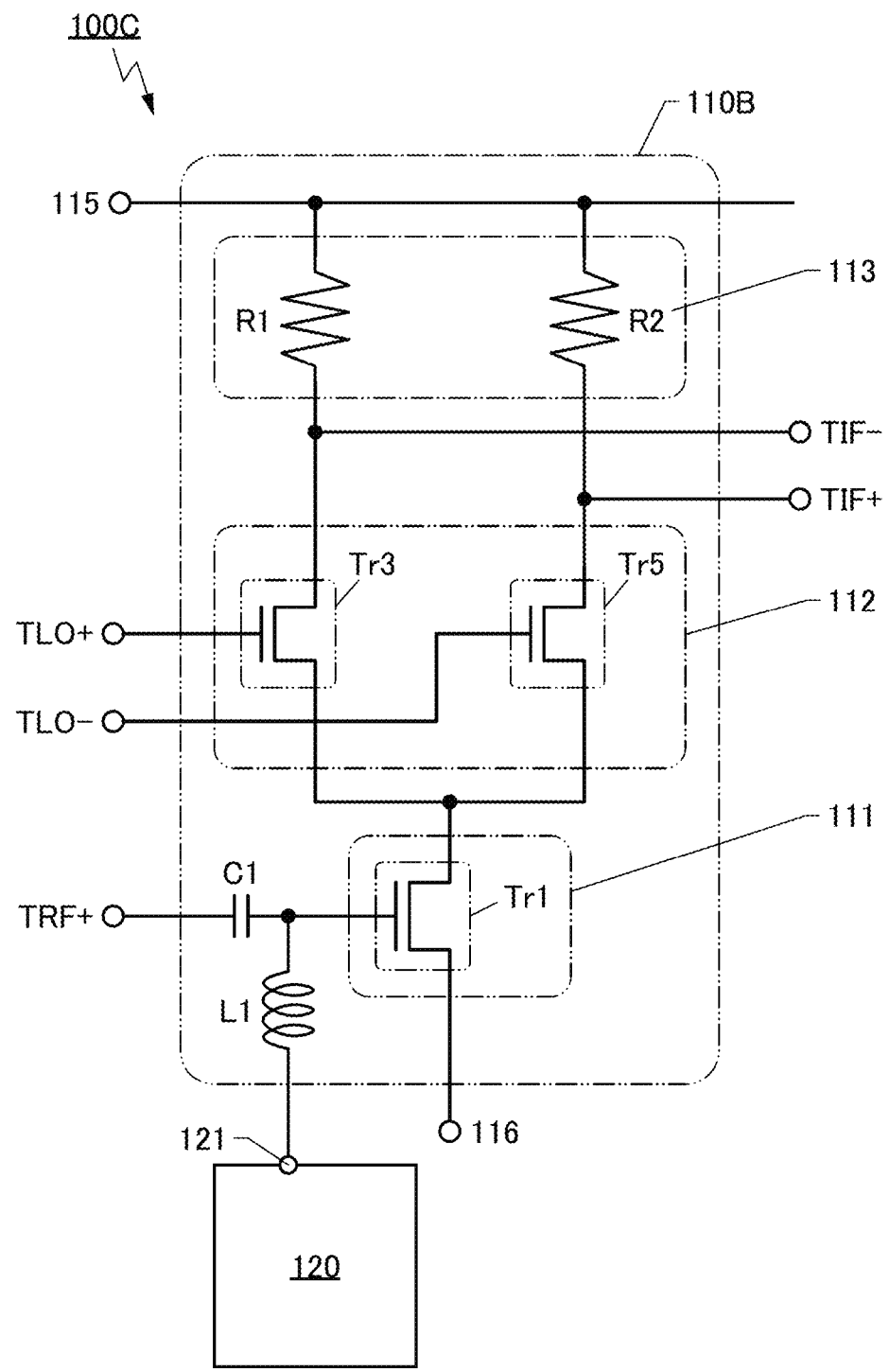
FIG. 7 is a diagram illustrating a semiconductor device of one embodiment of the present invention.

One embodiment of the present invention can also be used in a single-balanced mixer circuit. FIG. 7 illustrates a circuit diagram of a semiconductor device 100C of one embodiment of the present invention. The semiconductor device 100C includes a single-balanced mixer circuit 110B. The semiconductor device 100C is a variation example of the semiconductor device 100A. The semiconductor device 100C does not include any of the transistor Tr2, the transistor Tr4, the transistor Tr6, the capacitor C2, the inductor L2, and the terminal TRF− among the components included in the semiconductor device 100A.

Feedthrough is likely to occur between the terminal TLO (the terminal TLO+ and the terminal TLO−) and the terminal TIF (the terminal TIF+ and the terminal TIF−) in the semiconductor device 100C than in the semiconductor device 100A; however, circuit design and occupation area reduction can be performed easier in the semiconductor device 100C than in the semiconductor device 100A.

Note that in this specification and the like, in the case where the semiconductor device 100A, the semiconductor device 100B, and the semiconductor device 100C do not need to be differentiated from each other, or the case where any one of the semiconductor device 100A, the semiconductor device 100B, and the semiconductor device 100C is to be described, the expression "semiconductor device 100" is used in some cases.

In this specification and the like, in the case where the mixer circuit 110A and the mixer circuit 110B do not need to be differentiated from each other, or the case where one of the mixer circuit 110A and the mixer circuit 110B is to be described, the expression "mixer circuit 110" is used in some cases.

The composition, structure, method, and the like described in this embodiment can be used in combination as appropriate with the compositions, structures, methods, and the like described in the other embodiments and the like.

Embodiment 2

In this embodiment, a structure example of a wireless communication device including an integrated circuit including the semiconductor device 100A and the like described in the above embodiment is described with reference to FIG. 9 and FIG. 10. Although a description in this embodiment is made on the assumption that the wireless communication device is a portable information terminal, the wireless communication device may be another wireless communication terminal such as a portable game console, a tablet PC (Personal Computer), or a laptop PC. At least part of the structure of the wireless communication device of this embodiment can be used for a device that can perform wireless communication.

Figure 9:
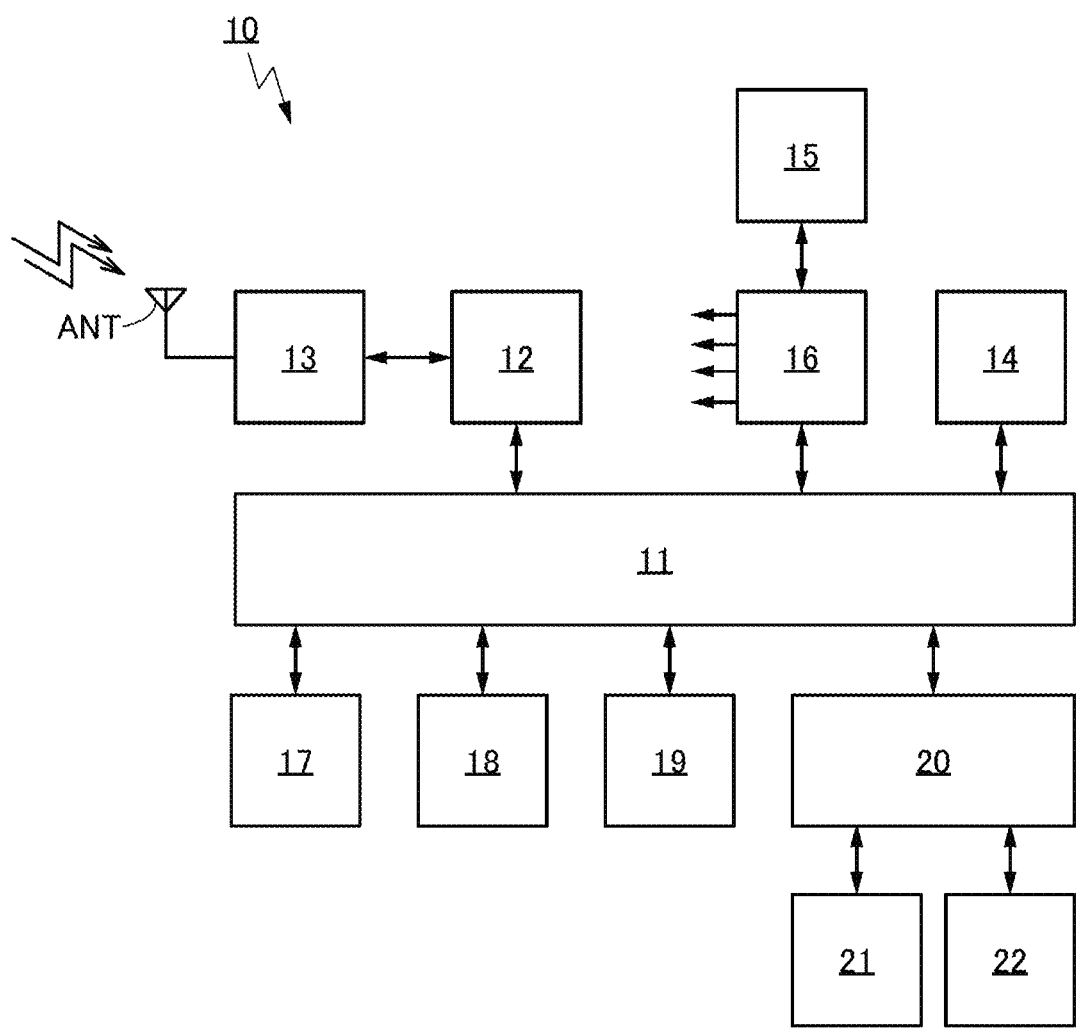
FIG. 9 is a diagram illustrating a structure example of a wireless communication device.

FIG. 9 is a block diagram of a wireless communication device 10. The wireless communication device 10 includes an antenna ANT, an application processor 11, a baseband processor 12, an integrated circuit 13 (IC), a memory 14, a battery 15, a power management IC (PMIC) 16, a display portion 17, a camera portion 18, an operation input portion 19, an audio IC 20, a microphone 21, and a speaker 22. Note that the integrated circuit 13 is also referred to as an RF (Radio Frequency) IC or a wireless chip, for example.

A plurality of antennas ANT may be provided for compatibility with 5G communication standard.

The application processor 11 has a function of performing processing for fulfilling various functions of the wireless communication device 10 by reading out a program stored in the memory 14. For example, the application processor 11 has a function of executing an OS (Operating System) program from the memory 14 and executing an application program with this OS program as an operating platform.

The baseband processor 12 has a function of performing baseband processing including encoding (e.g., error correction encoding) processing, decoding processing, or the like on data that is transmitted and received by the wireless communication device 10. Specifically, the baseband processor 12 has a function of receiving transmission data from the application processor 11, performing encoding processing on the received transmission data, and transmitting the data to the integrated circuit 13. In addition, the baseband processor 12 has a function of receiving reception data from the integrated circuit 13, performing decoding processing on the received reception data, and transmitting the data to the application processor 11.

The integrated circuit 13 has a function of performing modulation processing or demodulation processing on data that is transmitted and received by the wireless communication device 10. Specifically, the integrated circuit 13 has a function of generating a transmission signal by performing modulation processing using a carrier wave on the transmission data received from the baseband processor 12 and outputting the transmission signal via the antenna ANT. In addition, the integrated circuit 13 has a function of receiving a reception signal via the antenna ANT, generating reception data by performing demodulation processing using a carrier wave on the reception signal, and transmitting the reception data to the baseband processor 12. Accordingly, the integrated circuit 13 is referred to as "transmission/reception device" in some cases.

The memory 14 has a function of storing a program and data used by the application processor 11. Note that the memory 14 includes a nonvolatile memory that holds stored data even when power supply is interrupted and a volatile memory that loses stored data in the case where power supply is interrupted.

The battery 15 is used when the wireless communication device 10 operates without an external power supply device. Note that the wireless communication device 10 can use power supply from the battery 15 also in the case where an external power supply is connected. A secondary battery capable of charging and discharging is preferably used as the battery 15.

The power management IC 16 has a function of generating internal power supply voltage from the battery 15 or the external power supply. The internal power supply voltage is applied to each of the blocks in the wireless communication device 10. At this time, the power management IC 16 has a function of controlling voltage of the internal power supply voltage for each block to which the internal power supply voltage is supplied. The power management IC 16 controls voltage of the internal power supply voltage on the basis of an instruction from the application processor 11. In addition, the power management IC 16 can control supply and interrupt of supply of the internal power supply voltage block by block. The power management IC 16 also has a function of controlling charging to the battery 15 in the case where supply from the external power supply device is obtained.

The display portion 17 is a liquid crystal display device or a light-emitting display device and has a function of displaying various images in response to processing in the application processor 11. Images to be displayed on the display portion 17 include a user interface image with which a user gives an operation instruction to the wireless communication device 10, a camera image, a moving image, and the like.

The camera portion 18 has a function of acquiring an image in accordance with the instruction from the application processor 11. The operation input portion 19 has a function of a user interface for a user to operate and give an operation instruction to the wireless communication device 10. The audio IC 20 has a function of driving the speaker 22 by decoding audio data transmitted from the application processor 11. In addition, the audio IC 20 has a function of generating audio data by encoding audio information obtained by the microphone 21 and outputting the audio data to the application processor 11.

Figure 10:
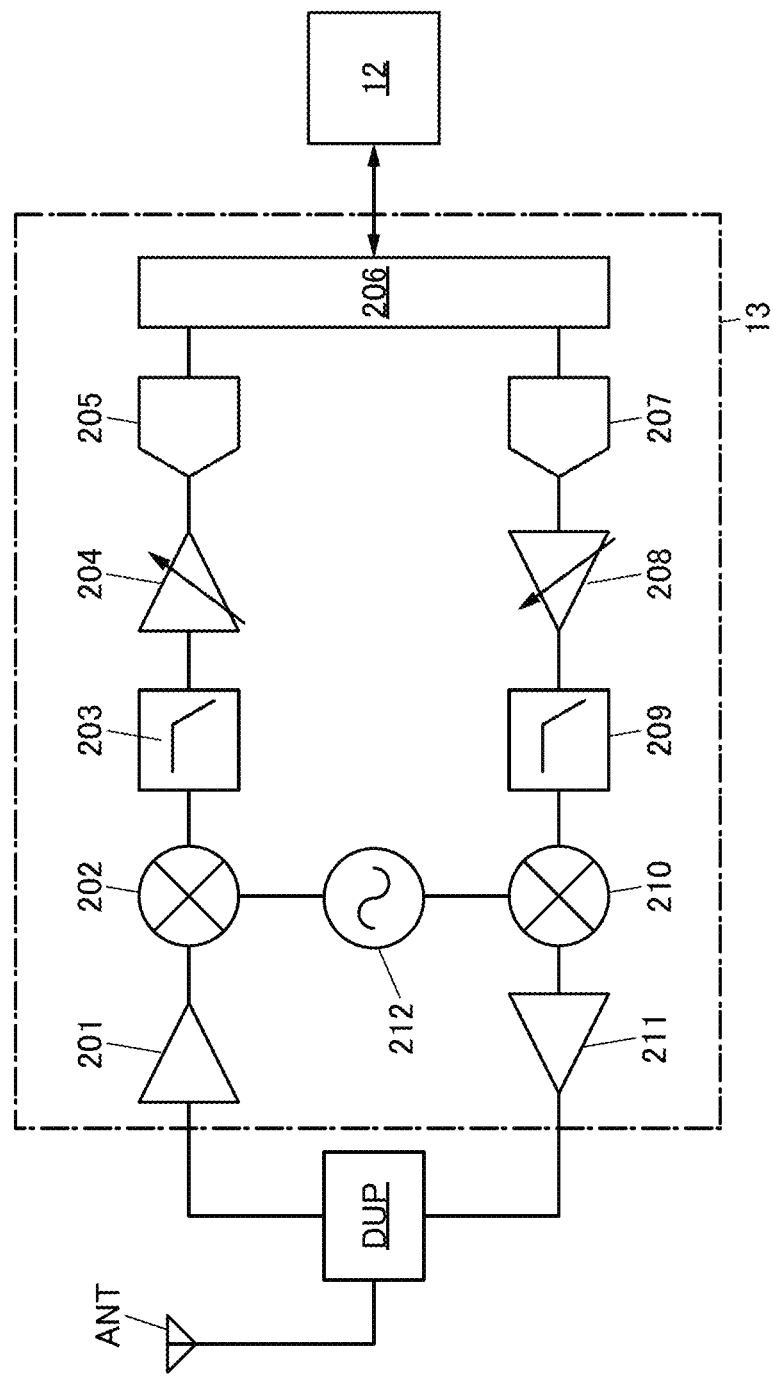
FIG. 10 is a diagram illustrating a structure example of a wireless communication device.

FIG. 10 is a block diagram illustrating a structure example of the integrated circuit 13. The integrated circuit 13 illustrated in FIG. 10 includes a low noise amplifier 201, a mixer 202, a low-pass filter 203, a variable gain amplifier 204, an analog-digital converter circuit 205, an interface portion 206, a digital-analog converter circuit 207, a variable gain amplifier 208, a low-pass filter 209, a mixer 210, a power amplifier 211, and an oscillation circuit 212. FIG. 10 also illustrates the antenna ANT, a duplexer DUP, and the baseband processor 12. Note that the low noise amplifier 201, the mixer 202, the low-pass filter 203, the variable gain amplifier 204, and the analog-digital converter circuit 205 are collectively referred to as a receiving circuit block, and the digital-analog converter circuit 207, the variable gain amplifier 208, the low-pass filter 209, the mixer 210, and the power amplifier 211 are collectively referred to as a transmitting circuit block in some cases.

Note that the baseband processor 12 and the integrated circuit 13 are formed of separate semiconductor chips. The duplexer DUP includes an antenna switch and the like.

The low noise amplifier 201 amplifies a signal received by the antenna ANT with low noise. As the mixer 202, the semiconductor device 100A or the like described in the above embodiment can be used. The mixer 202 performs demodulation and downconversion (frequency conversion) using a signal of the oscillation circuit 212. The low-pass filter 203 removes an unnecessary high-frequency component from a signal from the mixer 202. The variable gain amplifier 204 amplifies an output signal from the low-pass filter 203 with a gain taking the input range of the analog-digital converter circuit 205 into account. The analog-digital converter circuit 205 converts the analog signal from the variable gain amplifier 204 into a digital signal. The digital signal is output to the baseband processor 12 via the interface portion 206 and a differential interface circuit.

The digital-analog converter circuit 207 converts the digital signal received by the interface portion 206 into an analog signal. The variable gain amplifier 208 amplifies an output signal from the digital-analog converter circuit 207. The low-pass filter 209 removes an unnecessary high-frequency component from a signal from the variable gain amplifier 208. As the mixer 210, the semiconductor device 100A or the like described in the above embodiment can be used. The mixer 210 performs modulation and upconversion (frequency conversion) using a signal of the oscillation circuit 212. The power amplifier 211 amplifies an output signal from the mixer 210 with a predetermined gain and outputs the signal.

Note that for the bias supply portion 122, the battery 15 or the external power supply may be used. Alternatively, a power supply controlled by the power management IC 16 may be used for the bias supply portion 122.

The composition, structure, method, and the like described in this embodiment can be used in combination as appropriate with the compositions, structures, methods, and the like described in the other embodiments and the like.

Embodiment 3

Figure 11A:
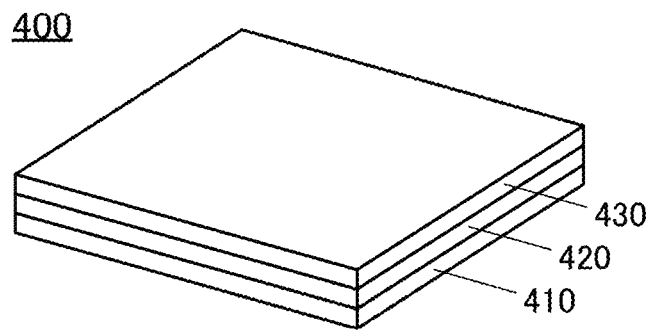
FIG. 11A is a perspective view of a semiconductor device 400.
Figure 11B:
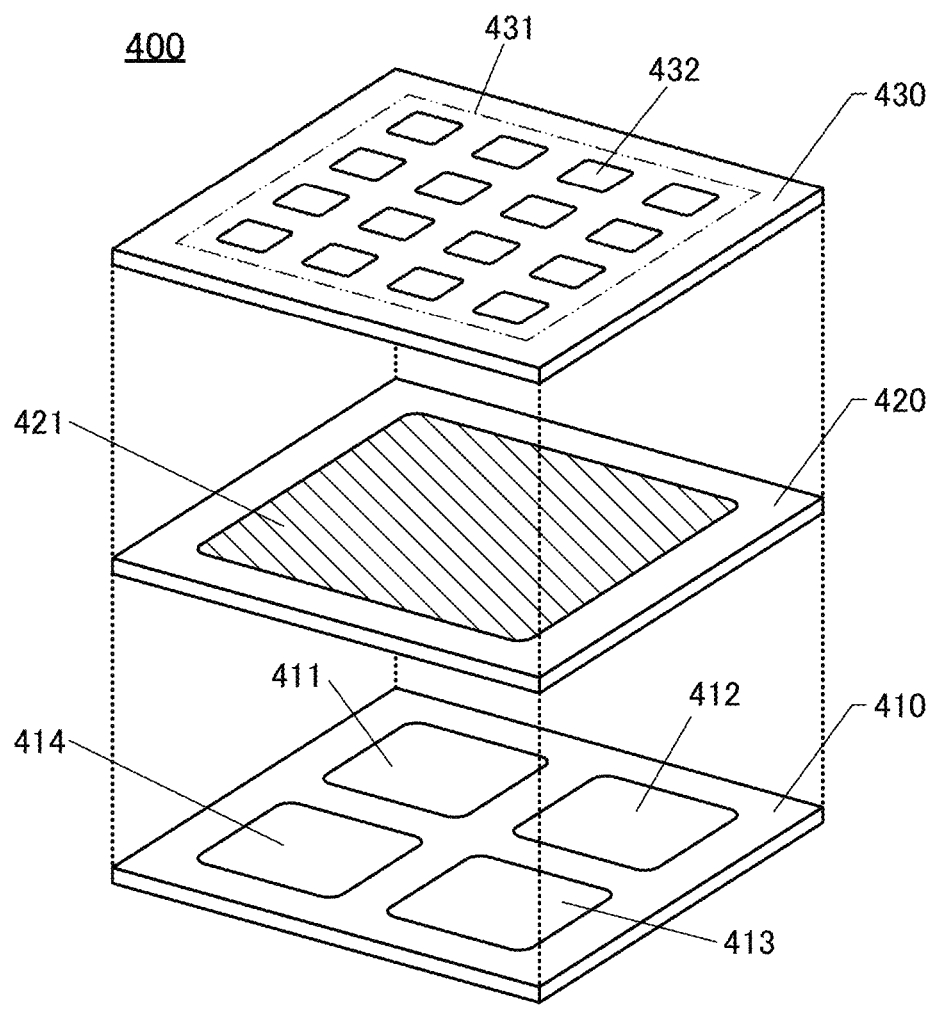
FIG. 11B is a perspective view illustrating a structure of the semiconductor device 400.

The semiconductor device 100 of one embodiment of the present invention may be stacked over a digital circuit. FIG. 11A is a perspective view of a semiconductor device 400. The semiconductor device 400 includes a layer 410, a layer 420, and a layer 430. FIG. 11B is a perspective view for illustrating a structure of the semiconductor device 400, and the layer 410, the layer 420, and the layer 430 are separately illustrated.

The layer 410 includes a digital circuit. For example, the layer 410 includes a control device 411, a memory device 412, an input/output device 413, the signal processing device 414, and the like. The control device 411 has a function of not only controlling the semiconductor device 100 but also controlling the operation of the whole semiconductor device 400. Note that an analog circuit may be provided in part of the layer 410.

[Control Device 411]

As the control device 411, microprocessors such as a central processing unit (CPU), a DSP (Digital Signal Processor), and a GPU (Graphics Processing Unit) can be used alone or in combination. A structure may be employed in which such a microprocessor is obtained with a PLD (Programmable Logic Device) such as an FPGA (Field Programmable Gate Array) or an FPAA (Field Programmable Analog Array).

[Memory Device 412]

As the memory device 412, a memory device using a nonvolatile memory element, such as a flash memory, an MRAM (Magnetoresistive Random Access Memory), a PRAM (Phase change RAM), an ReRAM (Resistive RAM), or an FeRAM (Ferroelectric RAM); a memory device using a volatile memory element, such as a DRAM (Dynamic RAM) or an SRAM (Static RAM); or the like may be used, for example.

Note that the memory device 412 is not incorporated in the semiconductor device 400, and a memory device located outside the semiconductor device 400 may be used as the memory device 412. In that case, the memory device 412 is connected through the input/output device 413.

[Input/Output Device 413]

The input/output device 413 is electrically connected to an external port or the like, for example, and has a function of transmitting and receiving a signal to/from the outside. The semiconductor device 400 can transmit and receive a signal to/from another semiconductor device through the input/output device 413. The input/output device 413 may be electrically connected to an input component such as a button or a switch. Examples of the external port to which the input/output device 413 is electrically connected include a USB terminal or a LAN (Local Area Network) connection terminal.

[Signal Processing Device 414]

The signal processing device 414 has a function of processing a signal received by a transmission/reception device 421, and supplying the processed signal to the control device 411, the memory device 412, and the input/output device 413. For example, the signal processing device 414 has a function of returning a signal transmitted in division with spatial multiplex transmission such as MIMO (multiple-input and multiple-output) to the original signal (a demodulation function). In addition, when data is transmitted from the semiconductor device 400 to the outside with spatial multiplex transmission, the signal processing device 414 has a function of converting the data into a transmission signal for spatial multiplex transmission.

Note that MIMO is a technique for dividing a signal to be transmitted into a plurality of communication paths (also referred to as "streams" or "space streams") and transmitting them at the same time. One stream includes one transmission antenna and one receiving antenna. Thus, the maximum number of streams is the same as the smaller number of the transmission antennas and the receiving antennas. When the number of streams is 10, an apparent transfer speed can be decupled.

The layer 410 can be formed using a single crystal semiconductor, a polycrystalline semiconductor, a microcrystalline semiconductor, an amorphous semiconductor, or the like alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor may be used.

The layer 420 includes a high frequency circuit and the like. For example, the layer 420 includes the transmission/reception device 421. For the transmission/reception device 421, the integrated circuit 13 or the like described in the above embodiment can be used, for example. Alternatively, the semiconductor device 100 or part of the semiconductor device 100 can be used for part of the transmission/reception device 421. The transmission/reception device 421 may include a plurality of integrated circuits 13 or the like. The transmission/reception device 421 may include a plurality of semiconductor devices 100, a plurality of parts of the semiconductor device 100, or the like.

The layer 420 may be formed using a material similar to that of the layer 410; alternatively, gallium arsenide, aluminum gallium arsenide, indium gallium arsenide, gallium nitride, indium phosphide, silicon germanium, or the like that can be used for a HEMT may be used. A semiconductor material that can be formed thin such as an oxide semiconductor or a silicon may be provided to overlap with the layer 420. Using a technique of forming a thin film can provide the digital circuit in the layer 410 and the high frequency circuit in the layer 420 three-dimensionally. Thus, the area occupied by the semiconductor device 400 can be reduced.

Part of the circuit included in the semiconductor device 100 may be provided in the layer 420, and another part thereof may be provided in the layer 410. For example, the mixer circuit 110 may be provided in the layer 420, and the bias circuit 120 may be provided in the layer 410. In the case where an oxide semiconductor is provided to overlap with the layer 420, an OS transistor included in the semiconductor device 100 can be provided to overlap with the layer 420.

The mobility of an oxide semiconductor is less likely to decrease compared with that of a silicon or the like in a high-temperature environment. With the use of an OS transistor as a transistor included in the layer 420, the circuit included in the layer 420 can be stably operated even when the temperature of the layer 410 increases. Consequently, the reliability of the semiconductor device can be improved.

The layer 420 may be formed over another substrate and attached to the layer 410.

The layer 430 includes an antenna array 431. The antenna array 431 includes a plurality of antennas 432. In the semiconductor device 400 illustrated in FIG. 11B, the antennas 432 are arranged in a matrix of 4×4.

When the antenna array 431 is provided in the semiconductor device 400, a communication technology such as beamforming or spatial multiplex transmission in the semiconductor device 400 can be achieved. Note that beamforming is a communication technology for transmitting a radio wave using a plurality of antennas. Strength of directivity or a transmission direction can be adjusted by adjusting phase inversion of a radio wave to be transmitted from each antenna. Directivity of a transmission radio wave is enhanced, whereby the radio wave can be transmitted farther. A radio wave can be transmitted to a specific region by adjusting the transmission direction.

Note that the stacking order of the layer 410, the layer 420, and the layer 430 is not limited to the stacking order illustrated in FIG. 11A and FIG. 11B. The stacking order of the layer 410, the layer 420, and the layer 430 is changed depending on the purpose or the like.

The composition, structure, method, and the like described in this embodiment can be used in combination as appropriate with the compositions, structures, methods, and the like described in the other embodiments and the like.

Embodiment 4

In this embodiment, structures of transistors that can be used in the semiconductor device described in the above embodiments are described. For example, a structure in which transistors having different electrical characteristics are stacked is described. With such a structure, the degree of freedom in design of a semiconductor device can be increased. Stacking transistors having different electrical characteristics can increase the integration degree of the semiconductor device.

Figure 12:
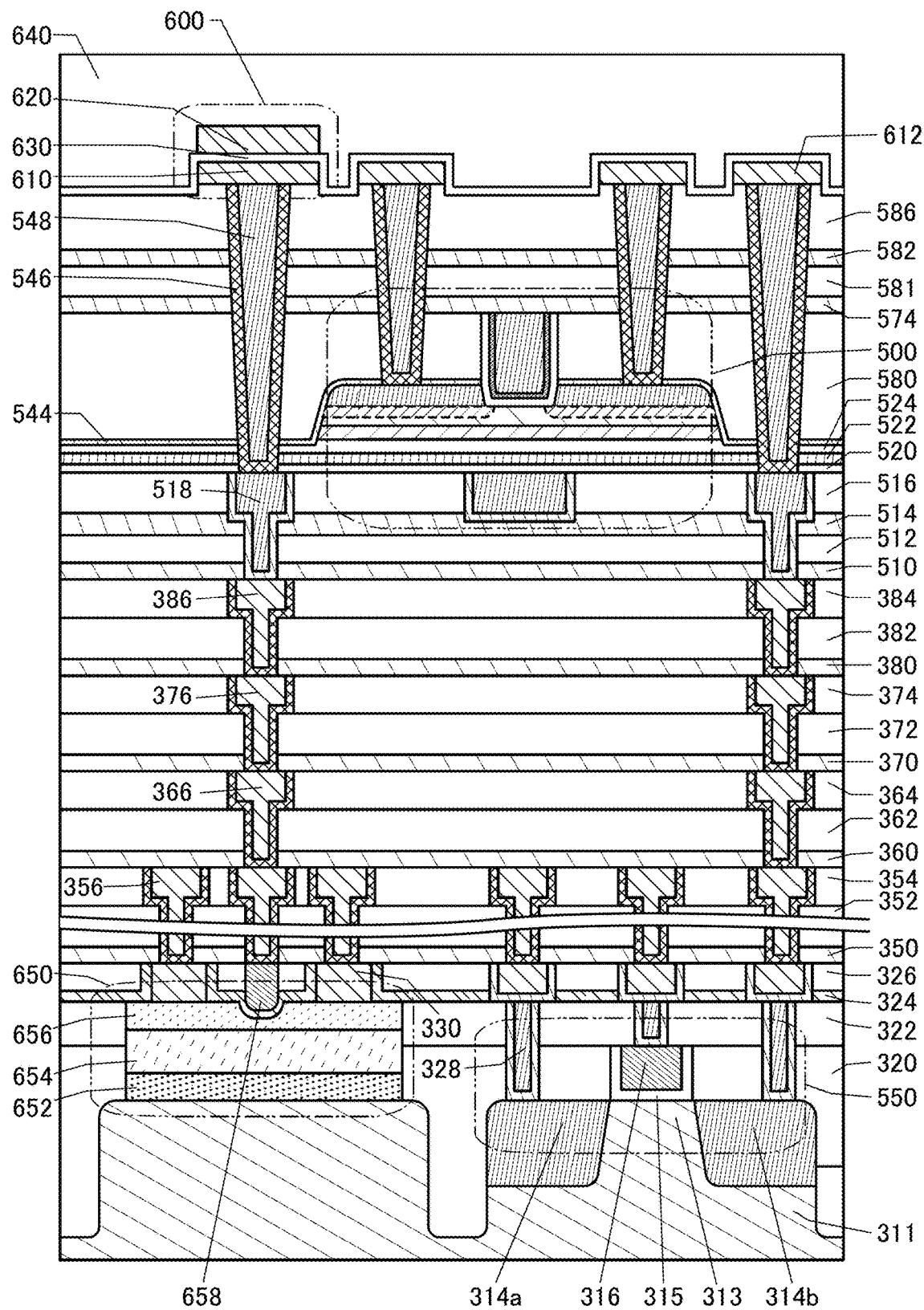
FIG. 12 is a diagram illustrating a structure example of a semiconductor device.
Figure 13A:
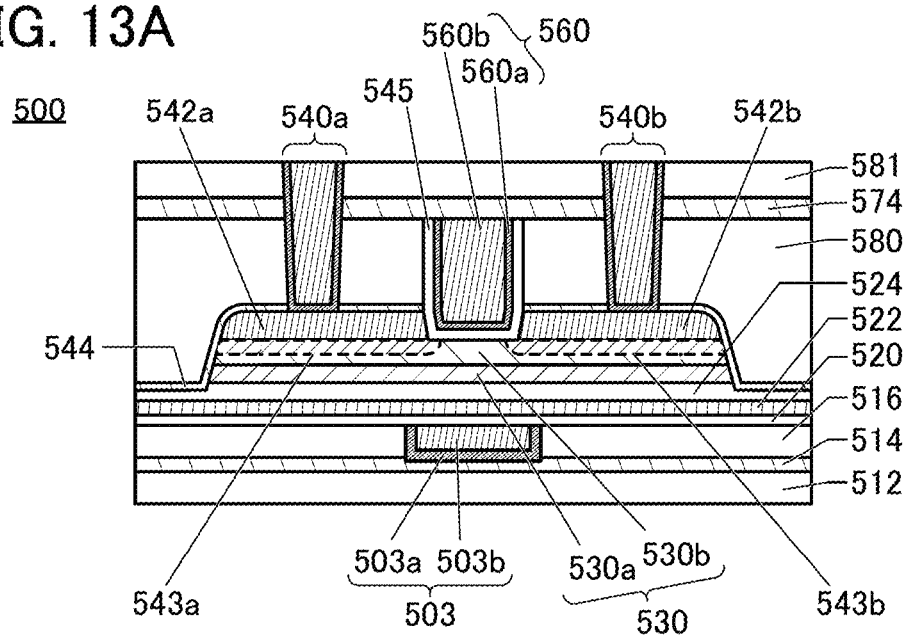
FIG. 13A to FIG. 13C are diagrams illustrating a structure example of a transistor.
Figure 13B:
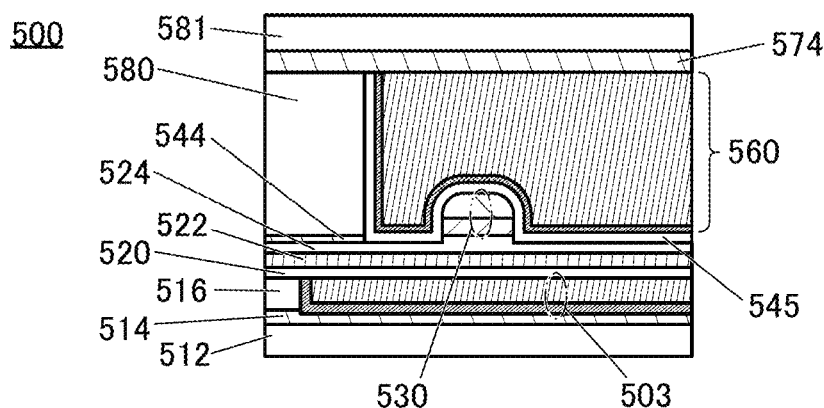
Figure 13C:
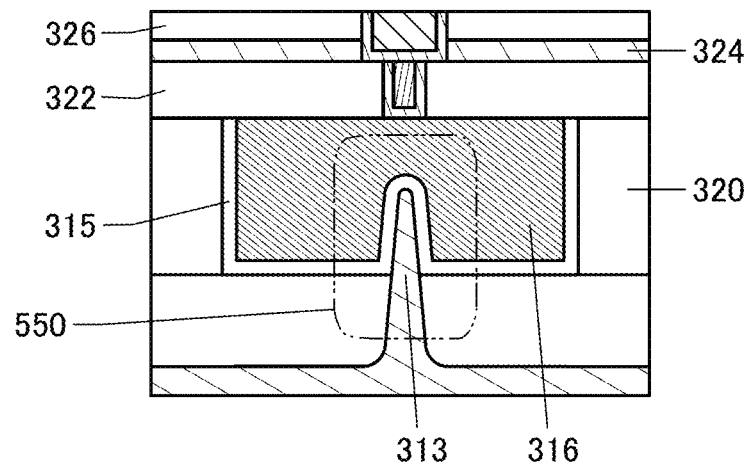

FIG. 12 illustrates part of a cross-sectional structure of a semiconductor device. The semiconductor device illustrated in FIG. 12 includes a transistor 550, a transistor 500, and a capacitor 600. FIG. 13A is a cross-sectional view of the transistor 500 in the channel length direction, FIG. 13B is a cross-sectional view of the transistor 500 in the channel width direction, and FIG. 13C is a cross-sectional view of the transistor 550 in the channel width direction. For example, the transistor 500 corresponds to the transistor M1 described in the above embodiment, the transistor 550 corresponds to the transistor included in the operational amplifier 125, and a transistor 650 corresponds to the transistor Tr1. The capacitor 600 corresponds to the capacitor C1.

The transistor 500 is an OS transistor. In FIG. 12, the transistor 500 is provided above the transistors 550 and 650, and the capacitor 600 is provided above the transistor 550, the transistor 650, and the transistor 500.

The transistor 550 is provided on a substrate 311 and includes a conductor 316, an insulator 315, a semiconductor region 313 that is part of the substrate 311, and a low-resistance region 314a and a low-resistance region 314b each functioning as a source region or a drain region.

As illustrated in FIG. 13C, a top surface and a side surface in the channel width direction of the semiconductor region 313 of the transistor 550 is covered with the conductor 316 with the insulator 315 therebetween. The use of such a Fin-type transistor as the transistor 550 can increase the effective channel width and thus improve on-state characteristics of the transistor 550. In addition, contribution of the electric field of the gate electrode can be increased, so that the off-state characteristics of the transistor 550 can be improved.

Note that the transistor 550 may be either a p-channel transistor or an n-channel transistor.

It is preferable that a region of the semiconductor region 313 where a channel is formed, a region in the vicinity thereof, the low-resistance region 314a and the low-resistance region 314b each functioning as the source region or the drain region, and the like contain a semiconductor such as a silicon-based semiconductor, further preferably single crystal silicon. Alternatively, a material containing Ge (germanium), SiGe (silicon germanium), GaAs (gallium arsenide), GaAlAs (gallium aluminum arsenide), or the like may be used. A structure may be employed in which silicon whose effective mass is controlled by applying stress to the crystal lattice and changing the lattice spacing is used. Alternatively, the transistor 550 may be a HEMT (High Electron Mobility Transistor) using GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing the element that imparts n-type conductivity, such as arsenic or phosphorus, or the element that imparts p-type conductivity, such as boron, or a conductive material such as a metal material, an alloy material, or a metal oxide material.

Note that a material used for a conductor determines the work function; thus, selecting the material used for the conductor can adjust the threshold voltage of the transistor. Specifically, titanium nitride, tantalum nitride, or the like is preferably used for the conductor. Furthermore, in order to ensure the conductivity and embeddability of the conductor, a stacked layer of metal materials such as tungsten and aluminum is preferably used for the conductor. In particular, tungsten is preferable in terms of heat resistance.

The transistor 550 may be formed using an SOI (Silicon on Insulator) substrate, for example.

The SOI substrate may be an SIMOX (Separation by Implanted Oxygen) substrate formed in such a manner that an oxygen ion is implanted into a mirror-polished wafer, and then, an oxide layer is formed at a certain depth from the surface and defects generated in a surface layer are eliminated by high-temperature heating or an SOI substrate formed by a Smart-Cut method in which a semiconductor substrate is cleaved by utilizing growth of a minute void, which is formed by implantation of a hydrogen ion, by heat treatment; an ELTRAN method (registered trademark: Epitaxial Layer Transfer); or the like. A transistor formed using a single crystal substrate contains a single crystal semiconductor in a channel formation region.

The transistor 650 is described here. The transistor 650 is formed over the same substrate where the transistor 550 is formed. The transistor 650 is formed using a semiconductor to be formed over a single crystal silicon substrate, a sapphire substrate, or an SOI substrate. The transistor 650 is a nitride semiconductor containing gallium in a channel formation region. The semiconductor preferably has a crystalline structure containing gallium. Examples of the semiconductor containing gallium include gallium nitride (hereinafter, GaN).

A semiconductor device using GaN for a semiconductor 654 is described with reference to the transistor 650 in FIG. 12. For example, GaN can be generated in such a manner that a buffer layer 652 is provided over the substrate 311 to make single crystal GaN epitaxially grow on the buffer layer 652. The epitaxially-grown single crystal GaN corresponds to the semiconductor 654. Note that in the example of FIG. 12, a single crystal silicon substrate is used as the substrate 311.

The transistor 650 is preferably formed using a semiconductor where a semiconductor 656 is epitaxially grown on the semiconductor 654. In the case where the semiconductor 654 is GaN, the semiconductor 656 is preferably AlGaN. For example, it is known that aluminum nitride (AlN) has superior material characteristics of a band gap (6.2 eV) that is approximately 2 times that of GaN, an electrostatic breakdown electric field (12 MV/cm) that is approximately 4 times that of GaN, and a thermal conductivity (2.9 W/cmK) that is approximately 1.5 times that of GaN. Therefore, AlN and AlGaN, which is a mixed crystal of AlN and GaN are preferable materials for a high-output and high-frequency device. A HEMT (High Electron Mobility Transistor) whose channel formation region is AlGaN can operate with a higher breakdown voltage than a HEMT whose channel formation region is GaN. Note that two dimensional electron gas (2DEG) is generated at the interface between GaN and AlGaN due to the polarization effect of GaN and AlGaN. That is, in a transistor with a HEMT structure, 2DEG is a channel formation region.

A conductor 330 is provided over the semiconductor 656. The conductor 330 corresponds to a source or a drain of the transistor 650.

An insulator 324 is provided between the conductor 658 and the semiconductor 656. Note that the conductor 658 may also be referred to as a gate electrode, and the insulator 324 may also be referred to as a gate insulator of the transistor 650. The insulator 324 can be formed using silicon oxide, aluminum oxide, hafnium oxide, or the like. For example, the insulator 324 contains any one of silicon oxide, aluminum oxide, and hafnium oxide, so that the off-state current of the transistor 650 is reduced. For detailed description of the gate insulator, the gate insulator is preferably a $SiO_2$ film, an $Al_2O_3$ film, or a $HfO_2$ film.

The transistor 650 preferably has a recessed gate structure. FIG. 12 illustrates an example in which the transistor 650 has a recessed gate structure. When the transistor 650 has a recessed gate structure, the off-state current of the transistor 650 can be reduced. The recessed gate structure is formed by thinning with etching of the semiconductor 656 that is in a position overlapping with the gate electrode and in which a channel formation region is formed. The region of the semiconductor 656 that is thinned with the etching is referred to as a recessed region. The recessed region can have a high threshold voltage due to increased depletion of 2DEG. In addition, large current can flow through a non-recessed region because the concentration of 2DEG is increased.

An insulator 320, an insulator 322, the insulator 324, and an insulator 326 are stacked sequentially to cover the transistor 550.

The insulator 320, the insulator 322, and the insulator 326 are formed using, for example, silicon oxide, silicon oxynitride, silicon nitride oxide, silicon nitride, aluminum oxide, aluminum oxynitride, aluminum nitride oxide, or aluminum nitride.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

The insulator 324 is preferably formed using a film having a barrier property that prevents hydrogen and impurities from diffusing from the substrate 311, the transistor 550, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. Specifically, the film that inhibits hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5\times10^{15}$ atoms/cm² in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. In the case where a material with a low dielectric constant is used for an interlayer film, the parasitic capacitance between wirings can be reduced.

In addition, a conductor 328, a conductor 330, and the like are embedded in the insulator 320, the insulator 322, the insulator 324, and the insulator 326. The conductor 330 has a function of the source electrode or the drain electrode of the transistor 650. Note that the conductor 328 and the conductor 330 each have a function of a plug or a wiring. Furthermore, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases, and part of a conductor functions as a plug in other cases.

As a material for each of the plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, an insulator 350, an insulator 352, and an insulator 354 are stacked sequentially in FIG. 12. Furthermore, a conductor 356 is formed in the insulator 350, the insulator 352, and the insulator 354. The conductor 356 has a function of a plug electrically connected to the transistor 550, a plug electrically connected to the transistor 650, or a wiring. Note that the conductor 356 can be provided using a material similar to those for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen.

Note that as the conductor having a barrier property against hydrogen, tantalum nitride is preferably used, for example. By stacking tantalum nitride and tungsten, which has high conductivity, hydrogen diffusion from the transistor 550 can be inhibited while the conductivity of a wiring is ensured. In that case, a tantalum nitride layer having a barrier property against hydrogen is preferably in contact with the insulator 350 having a barrier property against hydrogen.

A wiring layer may be provided over the insulator 354 and the conductor 356. For example, an insulator 360, an insulator 362, and an insulator 364 are stacked sequentially in FIG. 12. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening portion of the insulator 360 having a barrier property against hydrogen. In such a structure, the transistor 550 or the transistor 650 can be separated from the transistor 500 with a barrier layer, so that the hydrogen diffusion from the transistor 550 or the transistor 650 into the transistor 500 can be inhibited.

A wiring layer may be provided over the insulator 364 and the conductor 366. For example, an insulator 370, an insulator 372, and an insulator 374 are stacked sequentially in FIG. 12. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening portion of the insulator 370 having a barrier property against hydrogen. In such a structure, the transistor 550 or the transistor 650 can be separated from the transistor 500 with a barrier layer, so that the hydrogen diffusion from the transistor 550 or the transistor 650 into the transistor 500 can be inhibited.

A wiring layer may be provided over the insulator 374 and the conductor 376. For example, an insulator 380, an insulator 382, and an insulator 384 are stacked sequentially in FIG. 12. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening portion of the insulator 380 having a barrier property against hydrogen. In such a structure, the transistor 550 or the transistor 650 can be separated from the transistor 500 with a barrier layer, so that the hydrogen diffusion from the transistor 550 or the transistor 650 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, each of the insulator 510 and the insulator 514 is preferably formed using a film having a barrier property that can prevent diffusion of hydrogen and impurities from the substrate 311, a region where the transistor 550 is provided, a region where the transistor 650 is provided, or the like into a region where the transistor 500 is provided. Therefore, a material similar to that for the insulator 324 can be used.

For the film having a barrier property against hydrogen, for example, silicon nitride deposited by a CVD method can be used. As described above, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550 or the transistor 650.

For the film having a barrier property against hydrogen, for example, a metal oxide such as aluminum oxide, hafnium oxide, or tantalum oxide is preferably used for each of the insulator 510 and the insulator 514.

In particular, aluminum oxide has an excellent blocking effect that prevents both oxygen and impurities such as hydrogen and moisture, which can cause a change in electrical characteristics of the transistor, from passing through the film. Accordingly, the use of aluminum oxide can prevent entry of impurities such as hydrogen and moisture into the transistor 500 during and after a manufacturing process of the transistor. In addition, release of oxygen from the oxide included in the transistor 500 can be inhibited. Therefore, aluminum oxide is suitably used as a protective film for the transistor 500.

The insulator 512 and the insulator 516 can be formed using a material similar to that for the insulator 320, for example. In the case where a material with a relatively low dielectric constant is used for these insulators, the parasitic capacitance generated between wirings can be reduced. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is electrically connected to the capacitor 600, the transistor 550, or the transistor 650. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. In such a structure, the transistor 550 or the transistor 650 can be separated from the transistor 500 with a layer having a barrier property against oxygen, hydrogen, and water, so that the hydrogen diffusion from the transistor 550 or the transistor 650 into the transistor 500 can be inhibited.

The transistor 500 is provided above the insulator 516.

As illustrated in FIG. 13A and FIG. 13B, the transistor 500 includes the conductor 503 placed to be embedded in the insulator 514 and the insulator 516, an insulator 520 placed over the insulator 516 and the conductor 503, an insulator 522 placed over the insulator 520, an insulator 524 placed over the insulator 522, an oxide 530a placed over the insulator 524, an oxide 530b placed over the oxide 530a, a conductor 542a and a conductor 542b placed apart from each other over the oxide 530b, an insulator 580 that is placed over the conductor 542a and the conductor 542b and has an opening overlapping with a region between the conductor 542a and the conductor 542b, an insulator 545 placed on a bottom surface and a side surface of the opening, and a conductor 560 placed on the formation surface of the insulator 545.

As illustrated in FIG. 13A and FIG. 13B, an insulator 544 is preferably placed between the insulator 580 and the oxide 530a, the oxide 530b, the conductor 542a, and the conductor 542b. In addition, as illustrated in FIG. 13A and FIG. 13B, the conductor 560 preferably includes a conductor 560a provided inside the insulator 545 and a conductor 560b embedded inside the conductor 560a. Moreover, as illustrated in FIG. 13A and FIG. 13B, an insulator 574 is preferably placed over the insulator 580, the conductor 560, and the insulator 545.

In this specification and the like, the oxide 530a and the oxide 530b are sometimes collectively referred to as the oxide 530.

Note that although a structure of the transistor 500 in which two layers of the oxide 530a and the oxide 530b are stacked in a region where a channel is formed and its vicinity is illustrated, the present invention is not limited thereto. For example, a single layer of the oxide 530b or a stacked-layer structure of three or more layers may be provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. The transistor 500 illustrated in FIG. 12 and FIG. 13A is just an example and is not limited to the structure illustrated therein, and an appropriate transistor can be used in accordance with a circuit structure, a driving method, or the like.

Here, the conductor 560 functions as a gate electrode of the transistor, and the conductor 542a and the conductor 542b each function as a source electrode or a drain electrode. As described above, the conductor 560 is embedded in the opening of the insulator 580 and the region sandwiched between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be placed between the source electrode and the drain electrode in a self-aligned manner. Therefore, the conductor 560 can be formed without an alignment margin, resulting in a reduction of an area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance formed between the conductor 560 and each of the conductor 542a and the conductor 542b can be reduced. As a result, the transistor 500 can have increased switching speed and excellent frequency characteristics.

The conductor 560 functions as a first gate (also referred to as a top gate) electrode in some cases. The conductor 503 functions as a second gate (also referred to as a bottom gate) electrode in some cases. In that case, by changing a voltage applied to the conductor 503 independently of a voltage applied to the conductor 560, the threshold voltage of the transistor 500 can be controlled. In particular, when a negative voltage is applied to the conductor 503, the threshold voltage of the transistor 500 can be further increased, and the off-state current can be reduced. Thus, a drain current at the voltage application of 0 V to the conductor 560 can be smaller in the case where a negative voltage is applied to the conductor 503 than in the case where the negative voltage is not applied to the conductor 503.

The conductor 503 is provided to overlap with the oxide 530 and the conductor 560. Accordingly, in the case where voltages are applied to the conductor 560 and the conductor 503, an electric field generated from the conductor 560 and an electric field generated from the conductor 503 are connected, thereby covering the channel formation region formed in the oxide 530.

In this specification and the like, a transistor structure in which a channel formation region is electrically surrounded by the electric fields of a pair of gate electrodes (a first gate electrode and a second gate electrode) is referred to as a surrounded channel (S-channel) structure. Furthermore, in this specification and the like, the surrounded channel (S-channel) structure has a feature in that the side surface and the vicinity of the oxide 530 in contact with the conductor 542a and the conductor 542b functioning as the source electrode and the drain electrode are of I-type like the channel formation region. The side surface and the vicinity of the oxide 530 in contact with the conductor 542a and the conductor 542b are in contact with the insulator 544 and thus can be of I-type like the channel formation region. Note that in this specification and the like, "I-type" can be equated with "highly purified intrinsic" to be described later. The S-channel structure disclosed in this specification and the like is different from a Fin structure or a planar structure. With the use of the S-channel structure, a transistor with high resistance to a short-channel effect, i.e., a transistor in which a short-channel effect is unlikely to occur, can be obtained.

The conductor 503 has a structure similar to that of the conductor 518; a conductor 503a is formed in contact with an inner wall of the opening in the insulator 514 and the insulator 516, and a conductor 503b is formed further inside. Note that although the transistor 500 having a structure in which the conductor 503a and the conductor 503b are stacked is illustrated, the present invention is not limited thereto. For example, the conductor 503 may be provided as a single layer or to have a stacked-layer structure of three or more layers.

The conductor 503a is preferably formed using a conductive material having a function of inhibiting diffusion of impurities such as a hydrogen atom, a hydrogen molecule, a water molecule, and a copper atom (a conductive material through which the above impurities are less likely to pass). Alternatively, the conductor 503a is preferably formed using a conductive material having a function of inhibiting diffusion of oxygen (e.g., at least one of oxygen atoms, oxygen molecules, and the like) (a conductive material through which the above oxygen is less likely to pass). Note that in this specification, a function of inhibiting diffusion of impurities or oxygen means a function of inhibiting diffusion of any one or all of the above impurities and oxygen.

For example, when the conductor 503a has a function of inhibiting diffusion of oxygen, the conductivity of the conductor 503b can be prevented from being lowered because of oxidation.

In the case where the conductor 503 also functions as a wiring, the conductor 503b is preferably formed using a conductive material with high conductivity that contains tungsten, copper, or aluminum as its main component. Note that although the conductor 503 is illustrated to have a stacked layer of the conductor 503a and the conductor 503b in this embodiment, the conductor 503 may have a single-layer structure.

The insulator 520, the insulator 522, and the insulator 524 have a function of a second gate insulating film.

Here, an insulator containing oxygen more than that in the stoichiometric composition is preferably used as the insulator 524 in contact with the oxide 530. Such oxygen is easily released from the film by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies ($V_O$) in the oxide 530 can be reduced, leading to an improvement in reliability of the transistor 500. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom sometimes generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of a transistor. In one embodiment of the present invention, $V_OH$ in the oxide 530 is preferably reduced as much as possible so that the oxide 530 becomes a highly purified intrinsic or substantially highly purified intrinsic. In order to obtain such an oxide semiconductor with sufficiently reduced $V_OH$, it is important to remove impurities such as moisture and hydrogen in the oxide semiconductor (this treatment is also referred to as "dehydration" or "dehydrogenation treatment") and supply oxygen to the oxide semiconductor to fill oxygen vacancies (this treatment is also referred to as "oxygen adding treatment"). When an oxide semiconductor with sufficiently reduced $V_OH$ is used for a channel formation region of a transistor, the transistor can have stable electrical characteristics.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. In the TDS analysis, the film-surface temperature is preferably higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of "$V_OH \rightarrow V_O + H$" occurs. Part of hydrogen generated at this time is bonded to oxygen to be $H_2O$, and removed from the oxide 530 or an insulator near the oxide 530 in some cases. Some hydrogen may be gettered into the conductor 542a and/or the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, the heat treatment is preferably performed with a surface of the oxide 530 exposed. For example, the heat treatment is performed at a temperature higher than or equal to 100° C. and lower than or equal to 450° C., preferably higher than or equal to 350° C. and lower than or equal to 400° C. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas atmosphere or an inert gas atmosphere.

Note that the oxygen adding treatment performed on the oxide 530 can promote a reaction in which oxygen vacancies in the oxide 530 are filled with supplied oxygen, i.e., a reaction of "$V_O+O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In the case where the insulator 524 includes an excess-oxygen region, it is preferable that the insulator 522 have a function of inhibiting diffusion of oxygen (e.g., oxygen atoms and oxygen molecules) (through which the oxygen is less likely to pass).

The insulator 522 preferably has a function of inhibiting diffusion of oxygen or impurities, in which case diffusion of oxygen contained in the oxide 530 to the insulator 520 side is prevented. In addition, the conductor 503 can be inhibited from reacting with oxygen contained in the insulator 524 or the oxide 530.

The insulator 522 preferably has a single-layer structure or a stacked-layer structure using an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST), for example. With miniaturization and high integration of a transistor, a problem such as generation of leakage current sometimes arises because of a thin gate insulating film. When a high-k material is used for an insulator functioning as the gate insulating film, a gate voltage at the time of operating the transistor can be reduced while the physical thickness of the gate insulating film is kept.

It is particularly preferable to use an insulator containing an oxide of one or both of aluminum and hafnium, which is an insulating material having a function of inhibiting diffusion of impurities, oxygen, and the like (through which the oxygen is less likely to pass). Aluminum oxide, hafnium oxide, an oxide containing aluminum and hafnium (hafnium aluminate), or the like is preferably used for the insulator containing an oxide of one or both of aluminum and hafnium. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulator 520 be thermally stable. For example, silicon oxide and silicon oxynitride are suitable because of their thermal stability. Furthermore, combination of an insulator which is a high-k material and silicon oxide or silicon oxynitride enables the insulator 520 to have a stacked-layer structure that is thermally stable and has a high dielectric constant.

Note that in the transistor 500 in FIG. 13A and FIG. 13B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In that case, the stacked layers are not necessarily formed of the same material and may be formed of different materials.

In the transistor 500, a metal oxide functioning as an oxide semiconductor is used as the oxide 530 including a channel formation region. Note that the oxide semiconductor preferably contains at least one of In and Zn. For example, as the oxide 530, a metal oxide such as an In—M—Zn oxide (an element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor will be described in detail in another embodiment.

The metal oxide functioning as the channel formation region in the oxide 530 has a band gap of preferably greater than or equal to 2 eV, further preferably greater than or equal to 2.5 eV. The use of a metal oxide having such a wide band gap can reduce the off-state current of a transistor.

When the oxide 530a is provided below the oxide 530b in the oxide 530, impurities can be inhibited from diffusing into the oxide 530b from the components formed below the oxide 530a.

The oxide 530 preferably has a plurality of oxide layers that differ in the atomic ratio of metal atoms. Specifically, the atomic ratio of the element M to constituent elements in the metal oxide used as the oxide 530a is preferably greater than the atomic ratio of the element M to constituent elements in the metal oxide used as the oxide 530b. Moreover, the atomic ratio of the element M to In in the metal oxide used as the oxide 530a is preferably greater than the atomic ratio of the element M to In in the metal oxide used as the oxide 530b. Moreover, the atomic ratio of In to the element M in the metal oxide used as the oxide 530b is preferably greater than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum is gradually varied at a junction portion of the oxide 530a and the oxide 530b. In other words, the energy level of the conduction band minimum at the junction portion of the oxide 530a and the oxide 530b continuously changes or is continuously connected. To obtain this, the density of defect states in a mixed layer formed at the interface between the oxide 530a and the oxide 530b is preferably made low.

Specifically, when the oxide 530a and the oxide 530b contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as tantalum nitride is preferable because it has a barrier property against hydrogen or oxygen.

Although the conductor 542a and the conductor 542b have a single-layer structure in FIG. 13A, they may have a stacked-layer structure of two or more layers. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 13A, a region 543a and a region 543b are sometimes formed as low-resistance regions at the interface between the oxide 530 and the conductor 542a (the conductor 542b) and in the vicinity of the interface. In that case, the region 543a functions as one of a source region and a drain region, and the region 543b functions as the other of the source region and the drain region. A channel formation region is formed in a region sandwiched between the region 543a and the region 543b.

When the conductor 542a (the conductor 542b) is provided in contact with the oxide 530, the oxygen concentration of the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. For the insulator 544, silicon nitride oxide or silicon nitride can be used, for example.

It is particularly preferable to use, as the insulator 544, an insulator containing an oxide of one or both of aluminum and hafnium, for example, aluminum oxide, hafnium oxide, or an oxide containing aluminum and hafnium (hafnium aluminate). In particular, hafnium aluminate is preferable because it has higher heat resistance than a hafnium oxide film and thus is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is determined as appropriate in consideration of required transistor characteristics.

The insulator 544 can inhibit impurities such as water and hydrogen contained in the insulator 580 from diffusing into the oxide 530b. Furthermore, oxidation of the conductor 542a and/or the conductor 542b due to excess oxygen contained in the insulator 580 can be inhibited.

The insulator 545 functions as a first gate insulating film. The insulator 545 is preferably formed using an insulator which contains excess oxygen and from which oxygen is released by heating, like the insulator 524.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each containing excess oxygen can be used. In particular, silicon oxide and silicon oxynitride, which have thermal stability, are preferable.

When an insulator containing excess oxygen is provided as the insulator 545, oxygen can be effectively supplied from the insulator 545 to the channel formation region of the oxide 530b. As in the insulator 524, the concentration of impurities such as water or hydrogen in the insulator 545 is preferably lowered. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be inhibited. Moreover, oxidization of the conductor 560 due to excess oxygen can be inhibited. The metal oxide can be formed using a material that can be used for the insulator 544.

Note that the insulator 545 may have a stacked-layer structure like the second gate insulating film. With miniaturization and high integration of a transistor, a problem such as generation of leakage current sometimes arises because of a thin gate insulating film. Thus, when an insulator functioning as a gate insulating film has a stacked-layer structure of a high-k material and a thermally stable material, a gate voltage at the time of operating the transistor can be reduced while the physical thickness of the gate insulating film is kept. Furthermore, the stacked-layer structure can be thermally stable and have a high dielectric constant.

Although the conductor 560 functioning as the first gate electrode has a two-layer structure in FIG. 13A and FIG. 13B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. When the conductor 560a has a function of inhibiting diffusion of oxygen, the conductivity of the conductor 560b can be prevented from being lowered because of oxidization due to oxygen contained in the insulator 545. As a conductive material having a function of inhibiting diffusion of oxygen, for example, tantalum, tantalum nitride, ruthenium, or ruthenium oxide is preferably used. The conductor 560a can be formed using an oxide semiconductor that can be used for the oxide 530. In that case, when the conductor 560b is formed by a sputtering method, the conductor 560a can have a reduced electric resistance value and become a conductor. Such a conductor can be referred to as an OC (Oxide Conductor) electrode.

Furthermore, the conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. Silicon oxide and porous silicon oxide are particularly preferable because an excess-oxygen region can be easily formed in a later step.

When the insulator 580 from which oxygen is released by heating is provided, oxygen in the insulator 580 can be efficiently supplied to the oxide 530. The concentration of impurities such as water or hydrogen in the insulator 580 is preferably lowered.

The opening of the insulator 580 is formed to overlap with the region between the conductor 542a and the conductor 542b. Thus, the conductor 560 is formed to be embedded in the opening of the insulator 580 and the region sandwiched between the conductor 542a and the conductor 542b.

The gate length needs to be short for miniaturization of the semiconductor device without a reduction in the conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is provided to be embedded in the opening of the insulator 580 in this embodiment.

The insulator 574 is preferably provided in contact with a top surface of the insulator 580, a top surface of the conductor 560, and a top surface of the insulator 545. When the insulator 574 is formed by a sputtering method, the insulator 545 and the insulator 580 can include an excess-oxygen region. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used for the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method can serve as not only an oxygen supply source but also a barrier film against impurities such as hydrogen.

The insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are provided in the openings formed in the insulator 581, the insulator 574, the insulator 580, and the insulator 544. The conductor 540a and the conductor 540b are provided to face each other with the conductor 560 therebetween. The conductor 540a and the conductor 540b have a structure similar to that of a conductor 546 and a conductor 548 described later.

An insulator 582 is provided over the insulator 581. A substance having a barrier property against oxygen or hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

An insulator 586 is provided over the insulator 582. The insulator 586 can be formed using a material similar to that for the insulator 320. In the case where a material with a relatively low dielectric constant is used for these insulators, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have a function of plugs or wirings that are electrically connected to the capacitor 600, the transistor 500, or the transistor 550. The conductor 546 and the conductor 548 can each be provided using a material similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as some of the manufacturing steps of the transistor 500. The insulator having a high barrier property against hydrogen or water may be formed using a material similar to that for the insulator 522 or the insulator 514, for example.

Next, the capacitor 600 is provided above the transistor 650. The capacitor 600 includes a conductor 610, a conductor 620, and an insulator 630.

A conductor 612 may be provided over the conductor 546 and the conductor 548. The conductor 612 has a function of a plug or a wiring that is electrically connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in this embodiment; however, the structure is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be formed using a material similar to that for the insulator 320. The insulator 640 may function as a planarization film that covers a roughness thereunder.

With the use of the structure, a semiconductor device that includes a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance to the processing temperature in this embodiment may be used. Examples of a glass substrate include barium borosilicate glass, aluminosilicate glass, aluminoborosilicate glass, and soda lime glass. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Alternatively, polyamide, polyimide, an aramid resin, an epoxy resin, an inorganic vapor deposition film, and paper can be used. Specifically, the use of a semiconductor substrate, a single crystal substrate, an SOI substrate, or the like enables the manufacture of small-sized transistors with a small variation in characteristics, size, shape, or the like and with high current capability. A circuit using such transistors achieves lower power consumption or higher integration.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. The separation layer can be used when part or the whole of a semiconductor device formed over the separation layer is separated from the substrate and transferred to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, it is possible to manufacture a flexible semiconductor device or a highly durable semiconductor device, to provide heat resistance, or to reduce a weight or a thickness.

Providing a semiconductor device over a flexible substrate can suppress an increase in weight and can produce a non-breakable semiconductor device.

Variation Example 1 of Transistor

Figure 14A:
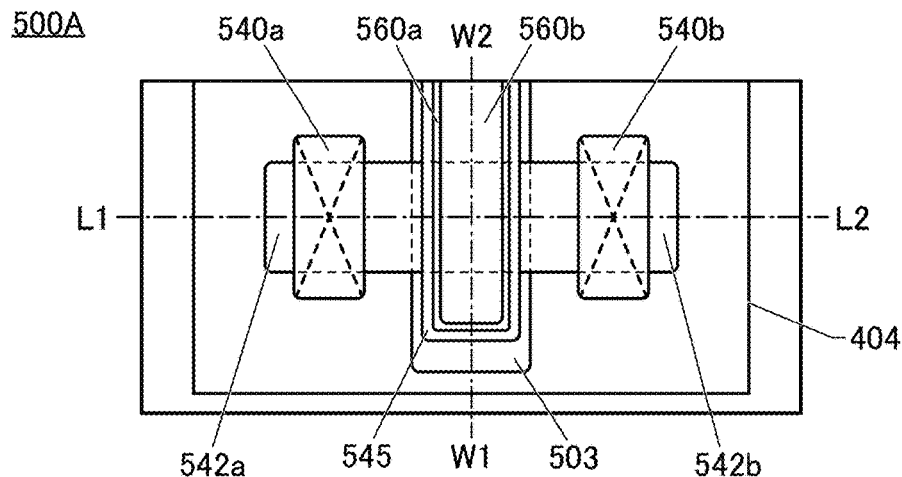
FIG. 14A to FIG. 14C are diagrams illustrating a structure example of a transistor.
Figure 14B:
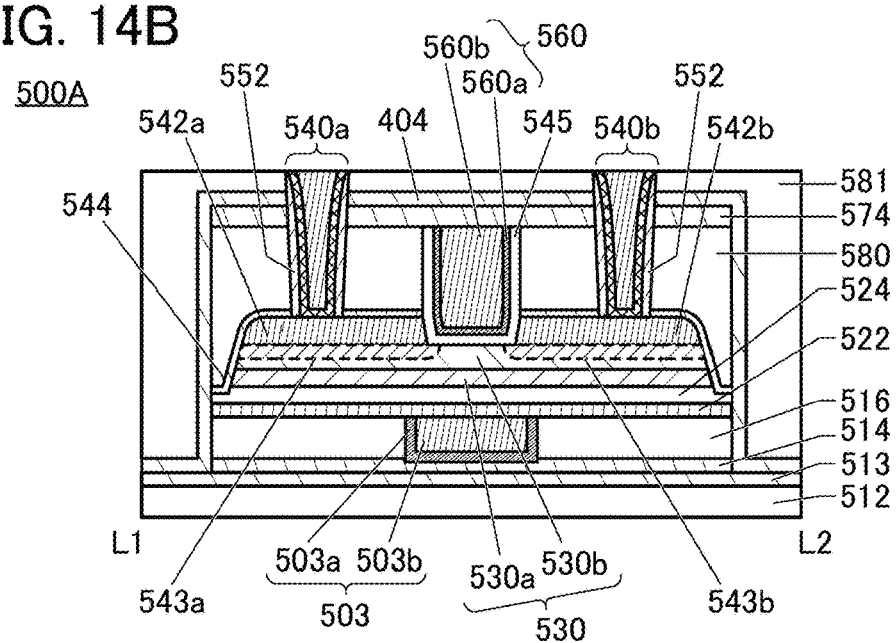
Figure 14C:
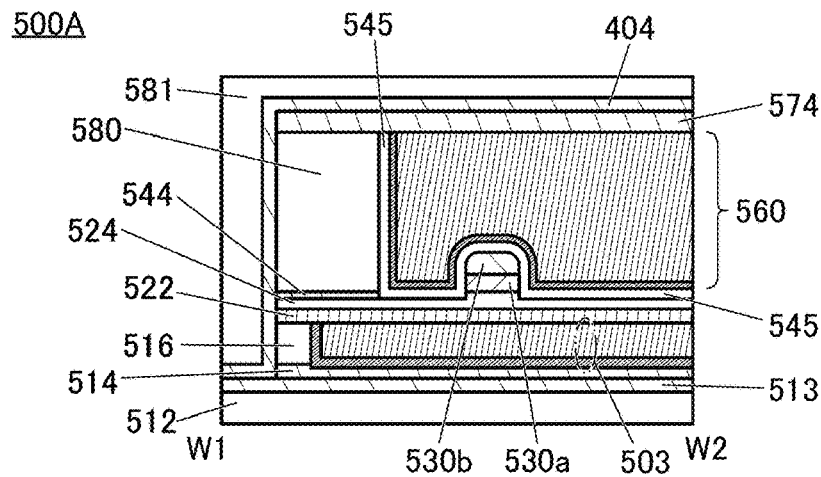

A transistor 500A illustrated in FIG. 14A to FIG. 14C is a variation example of the transistor 500 having the structure illustrated in FIG. 13A and FIG. 13B. FIG. 14A is a cross-sectional view of the transistor 500A in the channel length direction, FIG. 14B is a cross-sectional view of the transistor 500A in the channel length direction, and FIG. 14C is a cross-sectional view of the transistor 500A in the channel width direction. Note that for clarity of the drawing, some components are not illustrated in the top view of FIG. 14A. Note that the structure illustrated in FIG. 14A to FIG. 14C can be used for other transistors such as the transistor 550 included in the semiconductor device of one embodiment of the present invention.

The transistor 500A having the structure illustrated in FIG. 14A to FIG. 14C is different from the transistor 500 having the structure illustrated in FIG. 13A and FIG. 13B in including an insulator 552, an insulator 513, and an insulator 404. Another difference from the transistor 500 having the structure illustrated in FIG. 13A and FIG. 13B is that the insulators 552 are provided in contact with a side surface of the conductor 540a and a side surface of the conductor 540b. Another difference from the transistor 500 having the structure illustrated in FIG. 13A and FIG. 13B is that the insulator 520 is not included.

In the transistor 500 having the structure illustrated in FIG. 14A to FIG. 14C, the insulator 513 is provided over the insulator 512. The insulator 404 is provided over the insulator 574 and the insulator 513.

In the transistor 500 illustrated in FIG. 14A to FIG. 14C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of hydrogen atoms, hydrogen molecules, and the like) or water molecules. For example, the insulator 513 and the insulator 404 are preferably formed using silicon nitride or silicon nitride oxide with a high hydrogen barrier property. This can inhibit diffusion of hydrogen or the like into the oxide 530, thereby inhibiting the degradation of the characteristics of the transistor 500A. Thus, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that has a high hydrogen barrier property is preferably used. In particular, silicon nitride is suitably used for the insulator 552 because of its high hydrogen barrier property. The use of a material having a high hydrogen barrier property for the insulator 552 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. In this manner, the reliability of the semiconductor device of one embodiment of the present invention can be increased.

Variation Example 2 of Transistor

Figure 15A:
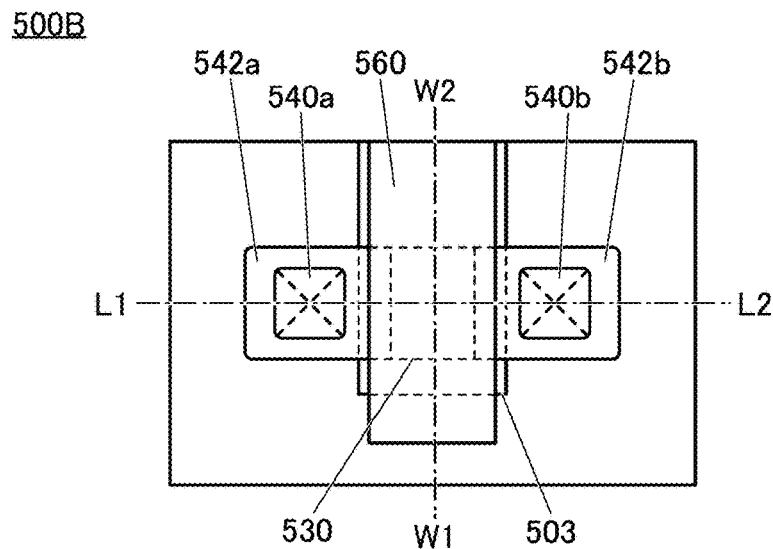
FIG. 15A to FIG. 15C are diagrams illustrating a structure example of a transistor.
Figure 15B:
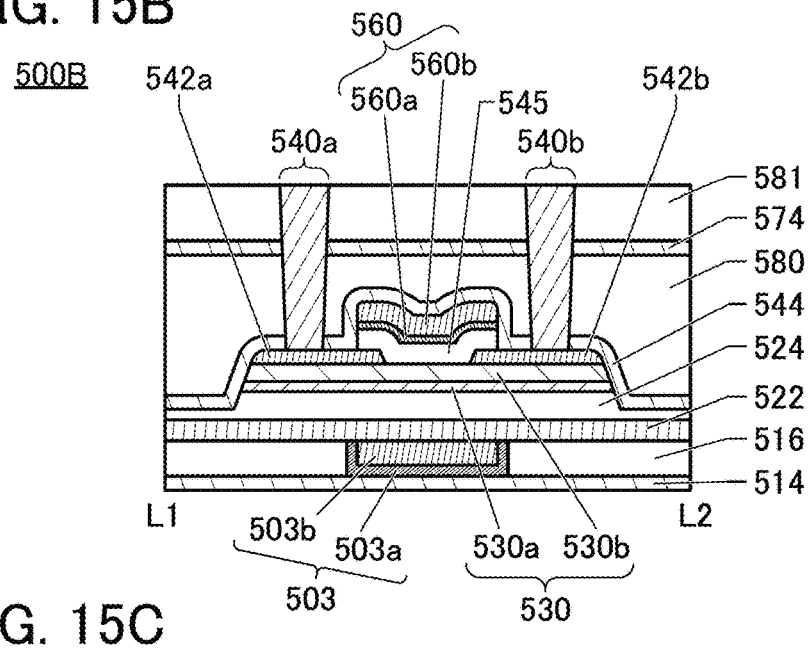
Figure 15C:
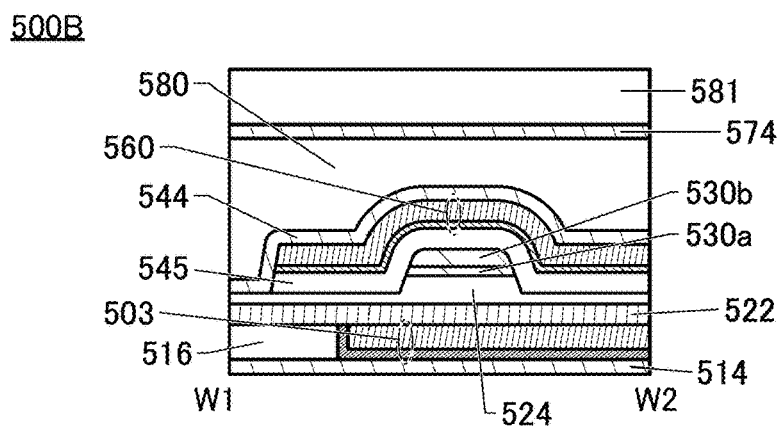

A structure example of a transistor 500B is described with reference to FIG. 15A, FIG. 15B, and FIG. 15C. FIG. 15A is a top view of the transistor 500B. FIG. 15B is a cross-sectional view of a portion indicated by a dashed-dotted line L1-L2 in FIG. 15A. FIG. 15C is a cross-sectional view of a portion indicated by a dashed-dotted line W1-W2 in FIG. 15A. Note that for simplification of the drawing, some components are not illustrated in the top view in FIG. 15A.

The transistor 500B is a variation example of the transistor 500 and can be replaced with the transistor 500. Accordingly, in order to avoid repeated description, differences of the transistor 500B from the transistor 500 are mainly described.

The conductor 560 functioning as the first gate electrode includes the conductor 560a and the conductor 560b over the conductor 560a. The conductor 560a is preferably formed using a conductive material having a function of inhibiting diffusion of impurities such as a hydrogen atom, a hydrogen molecule, a water molecule, and a copper atom. Alternatively, the conductor 560a is preferably formed using a conductive material having a function of inhibiting diffusion of oxygen (e.g., at least one of oxygen atoms, oxygen molecules, and the like).

When the conductor 560a has a function of inhibiting oxygen diffusion, the range of choices for the material of the conductor 560b can be expanded. That is, the conductor 560a inhibits oxidation of the conductor 560b, thereby preventing a decrease in conductivity of the conductor 560b.

The insulator 544 is preferably provided to cover the top surface and the side surface of the conductor 560 and a side surface of the insulator 545. Note that the insulator 544 is preferably formed using an insulating material having a function of inhibiting diffusion of oxygen and impurities such as water or hydrogen. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulator 544 can inhibit the oxidation of the conductor 560. In addition, the insulator 544 can inhibit diffusion of impurities such as water and hydrogen contained in the insulator 580 into the transistor 500B.

The transistor 500B has the conductor 560 overlapping part of the conductor 542a and part of the conductor 542b, and thus tends to have larger parasitic capacitance than the transistor 500. Thus, the transistor 500B tends to have a lower operation frequency than the transistor 500. However, the transistor 500B does not require a step of embedding the conductor 560, the insulator 545, and the like in the opening formed in the insulator 580 and the like; thus, the productivity of the transistor 500B is higher than that of the transistor 500.

The composition, structure, method, and the like described in this embodiment can be used in combination as appropriate with the compositions, structures, methods, and the like described in the other embodiments and the like.

Embodiment 5

In this embodiment, an oxide semiconductor, which is one kind of metal oxide, will be described.

A metal oxide preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of crystal structures of an oxide semiconductor will be described with reference to FIG. 16A. FIG. 16A shows the classification of crystal structures of an oxide semiconductor, typically IGZO (a metal oxide containing In, Ga, and Zn).

As shown in FIG. 16A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous (excluding single crystal and poly crystal). The term "Crystal" includes single crystal and poly crystal.

Note that the structures in the thick frame in FIG. 16A are in an intermediate state between "Amorphous" and "Crystal", and belong to a new boundary region (New crystalline phase). In other words, these structures are completely different from "Amorphous", which is energetically unstable, and "Crystal".

A crystal structure of a film or a substrate can be evaluated with an X-ray diffraction (XRD) spectrum. FIG. 16B shows an XRD spectrum, which is obtained by GIXD (Grazing-Incidence XRD) measurement, of a CAAC-IGZO film classified into "Crystalline". Note that the GIXD method is also called a thin film method or a Seemann-Bohlin method. The XRD spectrum that is shown in FIG. 16B and obtained by GIXD measurement is hereinafter simply referred to as an XRD spectrum. The CAAC-IGZO film in FIG. 16B has a composition in the neighborhood of In:Ga:Zn=4:2:3 [atomic ratio]. The CAAC-IGZO film in FIG. 16B has a thickness of 500 nm.

As shown in FIG. 16B, a clear peak indicating crystallinity is observed in the XRD spectrum of the CAAC-IGZO film. Specifically, a peak indicating c-axis alignment is detected at $2\theta$ of around 31° in the XRD spectrum of the CAAC-IGZO film. As shown in FIG. 16B, the peak at $2\theta$ of around 31° is asymmetric with respect to the axis of the angle at which the peak intensity (Intensity) is detected.

A crystal structure of a film or a substrate can also be evaluated with a diffraction pattern obtained by a nanobeam electron diffraction method (NBED) (such a pattern is also referred to as a nanobeam electron diffraction pattern). FIG. 16C shows a diffraction pattern of the CAAC-IGZO film. FIG. 16C shows a diffraction pattern obtained by the NBED method in which an electron beam is incident in the direction parallel to the substrate. The CAAC-IGZO film in FIG. 16C has a composition in the neighborhood of In:Ga:Zn=4:2:3 [atomic ratio]. In the nanobeam electron diffraction method, electron diffraction is performed with a probe diameter of 1 nm.

As shown in FIG. 16C, a plurality of spots indicating c-axis alignment are observed in the diffraction pattern of the CAAC-IGZO film.

<<Oxide Semiconductor Structure>>

Oxide semiconductors might be classified in a manner different from the one in FIG. 16A when classified in terms of the crystal structure. For example, oxide semiconductors are classified into a single crystal oxide semiconductor and a non-single-crystal oxide semiconductor.

Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor including a plurality of crystal regions whose c-axes are aligned in a particular direction. Note that the particular direction is the thickness direction of a CAAC-OS film, the normal direction of the surface where the CAAC-OS film is formed, or the normal direction of the surface of the CAAC-OS film. The crystal region has a periodic atomic arrangement. When an atomic arrangement is regarded as a lattice arrangement, the crystal region refers to a region with a regular lattice arrangement. Moreover, in some cases, the CAAC-OS includes a region where a plurality of crystal regions are connected to each other in the a-b plane direction, and this region has distortion. Note that distortion refers to a portion where the direction of a lattice arrangement changes between a region with a regular lattice arrangement and another region with a regular lattice arrangement in the region where the plurality of crystal regions are connected to each other. That is, the CAAC-OS is an oxide semiconductor that has c-axis alignment and does not have clear alignment in the a-b plane direction.

Note that the plurality of crystal regions are each formed of one or more minute crystals (crystals each of which has a maximum diameter less than 10 nm). The maximum diameter of a crystal region formed of one minute crystal is less than 10 nm. The size of a crystal region formed of a plurality of minute crystals may be approximately several tens of nanometers.

In an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Thus, the (M,Zn) layer contains indium in some cases. The In layer contains the element M in some cases, and contains Zn in other cases. The layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor where a channel of a transistor is formed. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Thus, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by Out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[A-Like OS]

The a-like OS is an oxide semiconductor having a structure between those of the nc-OS and the amorphous oxide semiconductor. The a-like OS has a void or a low-density region.

That is, the a-like OS has lower crystallinity than the nc-OS and the CAAC-OS. Moreover, the a-like OS has higher hydrogen concentration than the nc-OS and the CAAC-OS.

<<Oxide Semiconductor Structure>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and excellent switching operation can be achieved.

An oxide semiconductor can have any of various structures that show various different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor with high reliability can be obtained.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charges trapped by the trap states in an oxide semiconductor take a long time to disappear and may behave like fixed charges. Thus, a transistor whose channel formation region is formed in an oxide semiconductor having a high density of trap states has unstable electrical characteristics in some cases.

Thus, a reduction in the concentration of impurities in the oxide semiconductor is effective in stabilizing electrical characteristics of the transistor. In order to reduce the concentration of impurities in the oxide semiconductor, the concentration of impurities in an adjacent film is also preferably reduced. Examples of impurities include hydrogen, nitrogen, alkali metal, alkaline earth metal, iron, nickel, and silicon.

<Impurity>

The influence of impurities in the oxide semiconductor is described here.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated, in some cases. Accordingly, a transistor including an oxide semiconductor that contains alkali metal or alkaline earth metal tends to have normally-on characteristics. Thus, the concentration of alkali metal or alkaline earth metal in the oxide semiconductor measured by SIMS is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. Thus, a transistor including an oxide semiconductor that contains nitrogen as the semiconductor tends to have normally-on characteristics. When nitrogen is contained in the oxide semiconductor, trap states are sometimes formed. This might result in unstable electrical characteristics of the transistor. Thus, the concentration of nitrogen in the oxide semiconductor, which is measured by SIMS, is lower than $5\times10^{19}$ atoms/cm$^3$, preferably lower than or equal to 5×10$^{18}$ atoms/cm$^3$, further preferably lower than or equal to 1×10$^{18}$ atoms/cm$^3$, still further preferably lower than or equal to 5×10$^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom generates an electron serving as a carrier. Thus, a transistor including an oxide semiconductor that contains hydrogen tends to have normally-on characteristics. Accordingly, hydrogen in the oxide semiconductor is preferably reduced as much as possible. Specifically, the hydrogen concentration in the oxide semiconductor measured by SIMS is lower than 1×10$^{20}$ atoms/cm$^3$, preferably lower than 1×10$^{19}$ atoms/cm$^3$, further preferably lower than 5×10$^{18}$ atoms/cm$^3$, still further preferably lower than 1×10$^{18}$ atoms/cm$^3$.

When an oxide semiconductor with sufficiently reduced impurity concentration is used for a channel formation region of a transistor, the transistor can have stable electrical characteristics.

The composition, structure, method, and the like described in this embodiment can be used in combination as appropriate with the compositions, structures, methods, and the like described in the other embodiments and the like.

Embodiment 6

In this embodiment, application examples of the above-described semiconductor device will be described.

[Semiconductor Wafer and Chip]

Figure 17A:
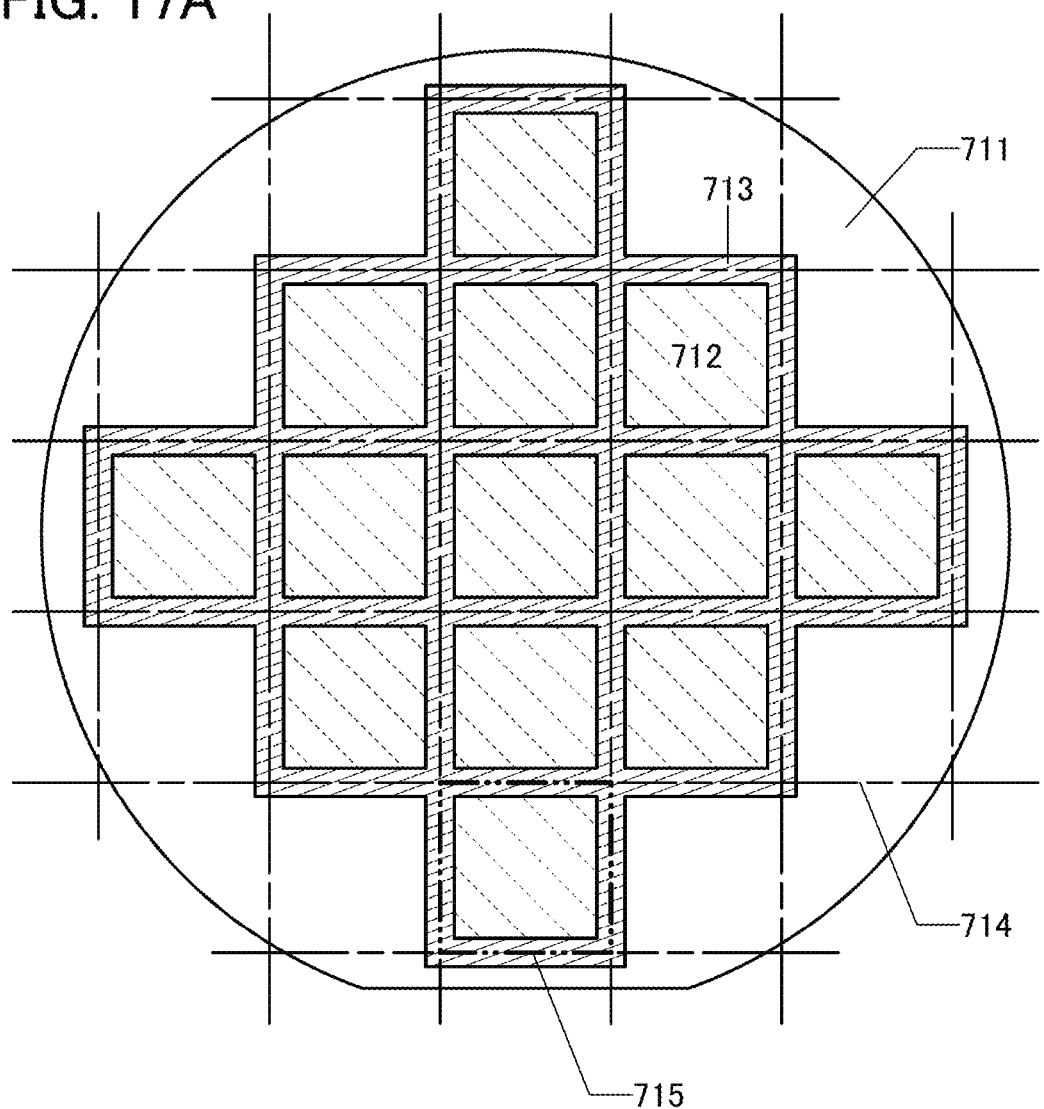
FIG. 17A is a top view of a semiconductor wafer.

FIG. 17A is a top view of a substrate 711 before dicing treatment. As the substrate 711, a semiconductor substrate (also referred to as a "semiconductor wafer") can be used, for example. A plurality of circuit regions 712 are provided on the substrate 711. A semiconductor device of one embodiment of the present invention, another functional circuit, or the like can be provided in the circuit region 712.

Figure 17B:
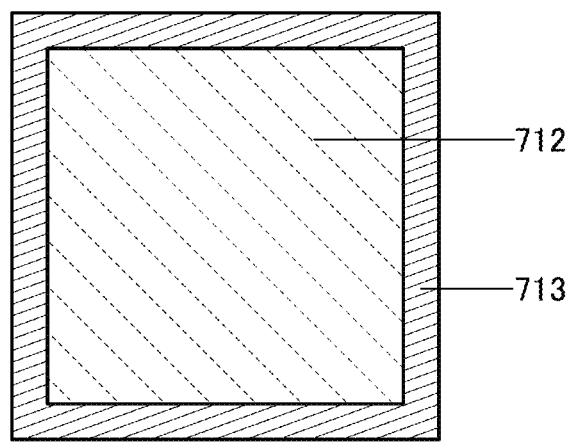
FIG. 17B is an enlarged view of a chip.

The plurality of circuit regions 712 are each surrounded by a separation region 713. Separation lines (also referred to as "dicing lines") 714 are set at a position overlapping with the separation regions 713. The substrate 711 is cut along the separation lines 714, whereby chips 715 including the circuit regions 712 can be cut out from the substrate 711. FIG. 17B is an enlarged view of the chip 715.

A conductor or a semiconductor may be provided in the separation regions 713. Providing a conductor or a semiconductor in the separation regions 713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductor or a semiconductor in the separation regions 713 allows a reduction in the usage of the pure water. Therefore, the cost of manufacturing semiconductor devices can be reduced. Moreover, semiconductor devices can be manufactured with improved productivity.

For a semiconductor provided in the separation regions 713, a material having a band gap of 2.5 eV or more and 4.2 eV or less, preferably 2.7 eV or more and 3.5 eV or less is preferably used. The use of such a material allows accumulated charges to be released slowly; thus, the rapid move of charges due to ESD can be suppressed and electrostatic breakdown is less likely to occur.

[Electronic Component]

FIG. 18 shows an example in which the chip 715 is used in an electronic component. Note that the electronic component is also referred to as a semiconductor package or an IC package. For electronic components, there are various standards and names corresponding to a terminal extraction direction and a terminal shape.

An electronic component is completed by combining the semiconductor device described in any of the above embodiments and components other than the semiconductor device in an assembly process (post-process).

Figure 18A:
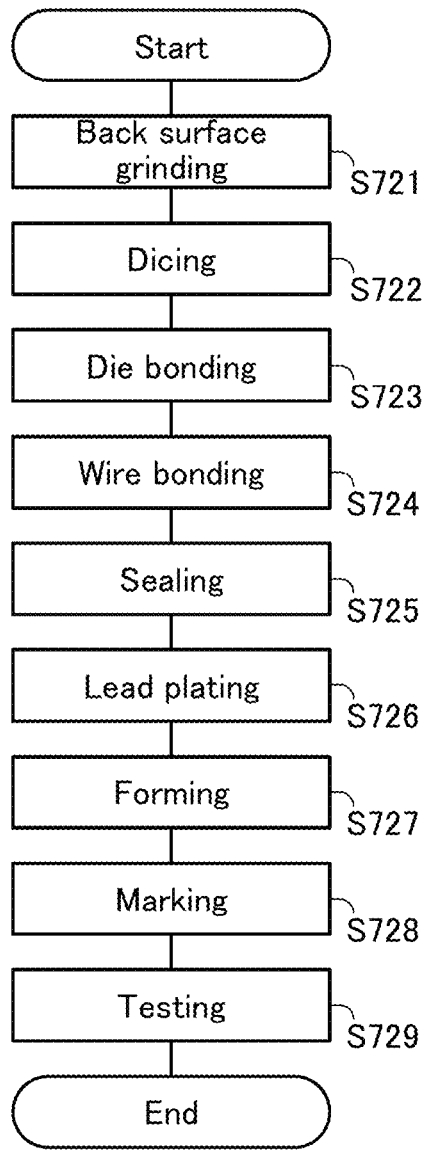
FIG. 18A is a flowchart showing an example of a fabricating process of an electronic component.

The post-process will be described with reference to a flow chart in FIG. 18A. After an element substrate including the semiconductor device described in the above embodiment is completed in a pre-process, a "back surface grinding step" of grinding a back surface (a surface where a semiconductor device and the like are not formed) of the element substrate is performed (Step S721). When the element substrate is thinned by grinding, warpage or the like of the element substrate is reduced, so that the size of the electronic component can be reduced.

Next, a "dicing step" of dividing the element substrate into a plurality of chips (chips 715) is performed (Step S722). Then, a "die bonding step" of separately picking up the divided chips and bonding the chips onto a lead frame is performed (Step S723). To bond a chip and a lead frame in the die bonding step, a method such as bonding using resin or a tape is selected as appropriate depending on products. Note that the chip may be bonded onto an interposer substrate instead of the lead frame.

Next, a "wire bonding step" of electrically connecting a lead of the lead frame and an electrode on the chip through a metal fine line (wire) is performed (Step S724). A silver line or a gold line can be used as the metal fine line. Ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (a decrease in reliability) due to moisture or dust can be reduced.

Subsequently, a "lead plating step" of plating the lead of the lead frame is performed (Step S726). This plating process prevents rust of the lead and enables more reliable soldering at the time of mounting the electronic component on a printed circuit board in a later step. Then, a "forming step" of cutting and forming of the lead is performed (Step S727).

Next, a "marking step" of printing (marking) on a surface of the package is performed (Step S728). After a "testing step" (Step S729) for checking whether an external shape is good and whether there is a malfunction, for example, the electronic component is completed.

Figure 18B:
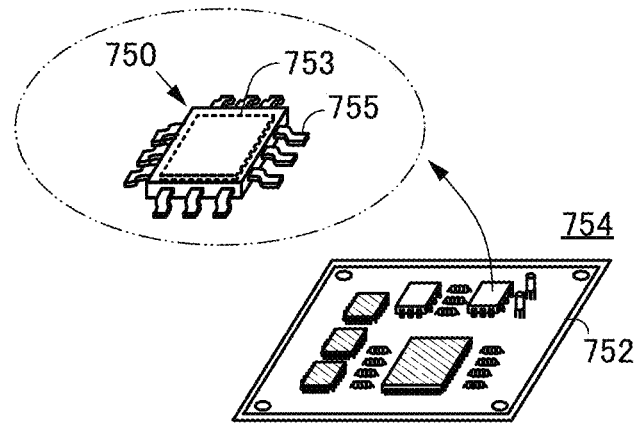
FIG. 18B is a schematic perspective view of the electronic component.

FIG. 18B is a schematic perspective view of a completed electronic component. FIG. 18B is a schematic perspective view illustrating a QFP (Quad Flat Package) as an example of the electronic component. An electronic component 750 illustrated in FIG. 18B includes a lead 755 and a semiconductor device 753. As the semiconductor device 753, the semiconductor device described in any of the above embodiments can be used, for instance.

The electronic component 750 in FIG. 18B is mounted on a printed circuit board 752, for example. A plurality of electronic components 750 are combined and electrically connected to each other over the printed circuit board 752; thus, a substrate on which the electronic components are mounted (a circuit board 754) is completed. The completed circuit board 754 is provided in an electronic device or the like.

[Electronic Device]

Next, examples of electronic devices including the semiconductor device of one embodiment of the present invention or the above-described electronic component will be described.

Examples of electronic devices including the semiconductor device of one embodiment of the present invention or the electronic component include display devices of televisions, monitors, and the like; lighting devices; desktop personal computers; laptop personal computers; word processors; image reproduction devices that reproduce still images and moving images stored in recording media such as DVDs (Digital Versatile Discs); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects and the like driven by electric motors using power from the power storage devices are also included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The semiconductor device of one embodiment of the present invention or the electronic component can be used for a communication device or the like incorporated in the electronic devices.

The electronic devices may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), for example.

The electronic devices can have a variety of functions such as a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium, for example.

Figure 19:
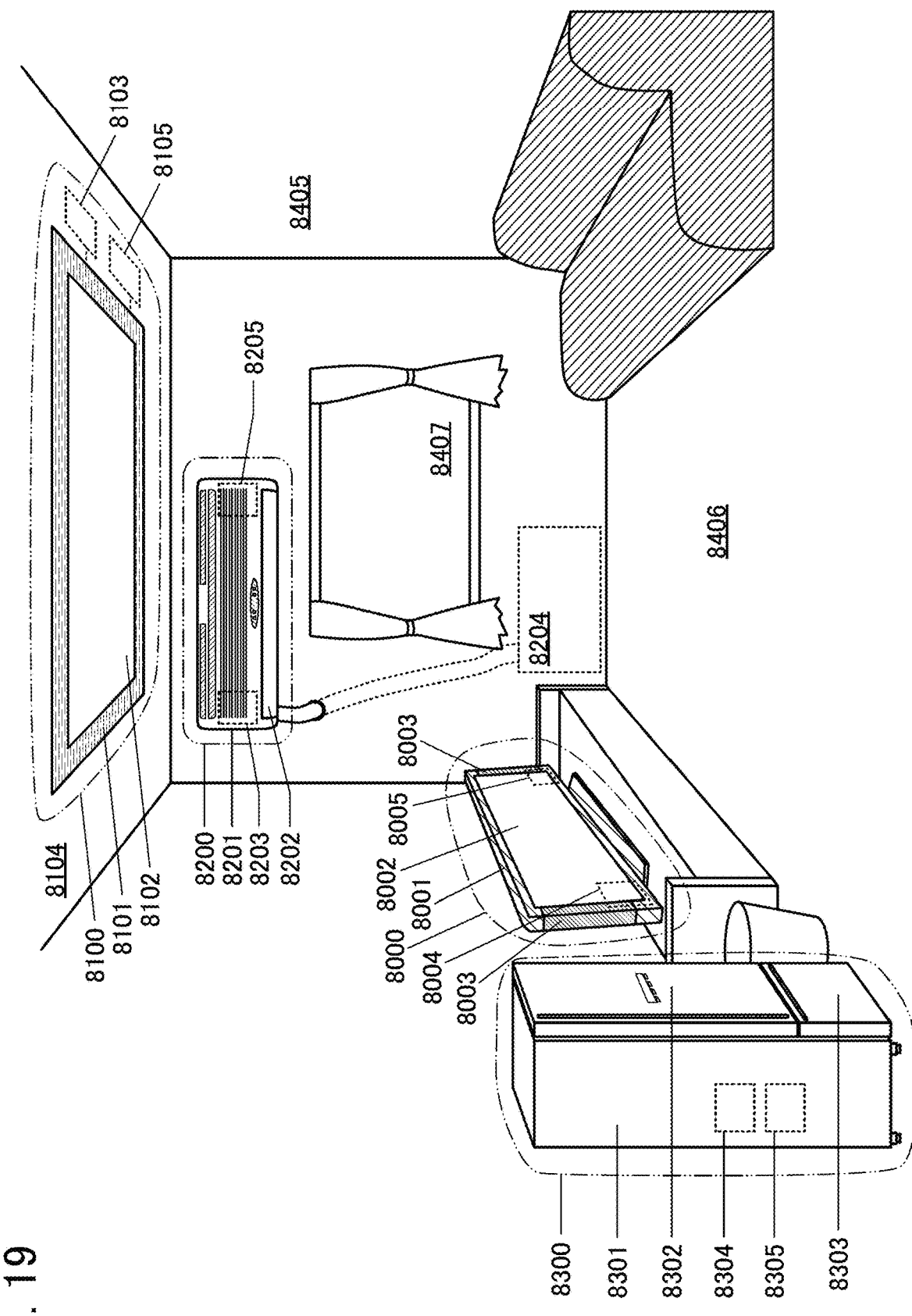
FIG. 19 is a diagram illustrating examples of electronic devices.

FIG. 19 and FIG. 20A to FIG. 20F illustrate examples of electronic devices. In FIG. 19, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 of one embodiment of the present invention is provided in the housing 8001. The semiconductor device 8004 can retain control data, a control program, or the like. The semiconductor device 8004 has a communication function, and the display device 8000 can function as an IoT device. Moreover, the display device 8000 can receive power from a commercial power supply or can use power stored in the power storage device 8005.

A display device such as a liquid crystal display device, a light-emitting display device in which a light-emitting element such as an organic EL element is provided in each pixel, an electrophoresis display device, a DMD (Digital Micromirror Device), a PDP (Plasma Display Panel), or an FED (Field Emission Display) can be used for the display portion 8002.

Note that the display device includes, in its category, all of information display devices for personal computers, advertisement displays, and the like besides TV broadcast reception.

In FIG. 19, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although FIG. 19 illustrates an example of the case where the semiconductor device 8103 is provided in a ceiling 8104 on which the housing 8101 and the light source 8102 are installed, the semiconductor device 8103 may be provided in the housing 8101. The semiconductor device 8103 can retain data such as emission luminance of the light source 8102, a control program, or the like. The semiconductor device 8103 has a communication function, and the lighting device 8100 can function as an IoT device. Furthermore, the lighting device 8100 can receive power from a commercial power supply or can use power stored in the power storage device.

Although FIG. 19 illustrates the installation lighting device 8100 provided in the ceiling 8104 as an example, the semiconductor device of one embodiment of the present invention can be used in an installation lighting device provided in, for example, a wall 8405, a floor 8406, a window 8407, or the like other than the ceiling 8104, or a tabletop lighting device or the like.

As the light source 8102, an artificial light source that emits light artificially by using power can be used. Specific examples of the artificial light source include an incandescent lamp, a discharge lamp such as a fluorescent lamp, and light-emitting elements such as an LED and an organic EL element.

In FIG. 19, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, a power storage device 8205, and the like. Although FIG. 19 illustrates an example of the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can retain control data, a control program, or the like of the air conditioner. The semiconductor device 8203 has a communication function, and the air conditioner can function as an IoT device. Furthermore, the air conditioner can receive power from a commercial power supply or can use power stored in the power storage device 8205.

Although FIG. 19 illustrates the split-type air conditioner including the indoor unit and the outdoor unit as an example, the semiconductor device of one embodiment of the present invention can be used in a unified-type air conditioner in which the functions of an indoor unit and an outdoor unit are included in one housing.

In FIG. 19, an electric refrigerator-freezer 8300 is an example of an electronic device including a semiconductor device 8304 of one embodiment of the present invention. Specifically, the electric refrigerator-freezer 8300 includes a housing 8301, a refrigerator door 8302, a freezer door 8303, the semiconductor device 8304, a power storage device 8305, and the like. In FIG. 19, the power storage device 8305 is provided in the housing 8301. The semiconductor device 8304 can retain control data, a control program, or the like of the electric refrigerator-freezer 8300. The semiconductor device 8304 has a communication function, and the electric refrigerator-freezer 8300 can function as an IoT device. Furthermore, the electric refrigerator-freezer 8300 can receive power from a commercial power supply or can use power stored in the power storage device 8305.

Figure 20A:
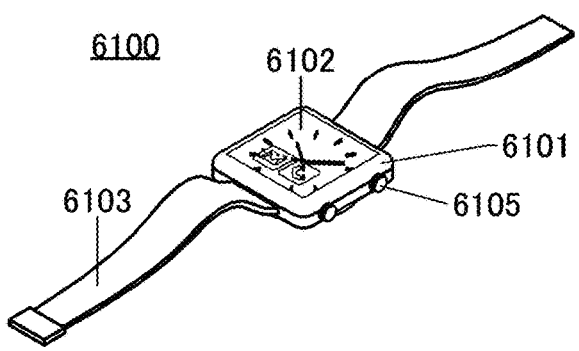
FIG. 20A to FIG. 20F are diagrams illustrating examples of electronic devices.

FIG. 20A illustrates an example of a watch-type portable information terminal. A portable information terminal 6100 includes a housing 6101, a display portion 6102, a band 6103, operation buttons 6105, and the like. The portable information terminal 6100 further includes a secondary battery and the semiconductor device of one embodiment of the present invention or the electronic component. The portable information terminal 6100 including the semiconductor device of one embodiment of the present invention or the electronic component can function as an IoT device.

Figure 20B:
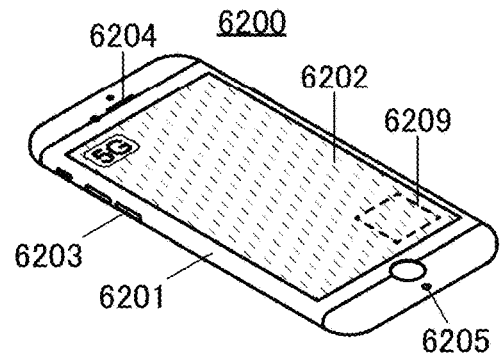

FIG. 20B illustrates an example of a portable information terminal. A portable information terminal 6200 includes a display portion 6202 incorporated in a housing 6201, operation buttons 6203, a speaker 6204, a microphone 6205, and the like.

The portable information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 further includes a secondary battery and the semiconductor device of one embodiment of the present invention or the electronic component. The portable information terminal 6200 including the semiconductor device of one embodiment of the present invention or the electronic component can function as an IoT device.

Figure 20C:
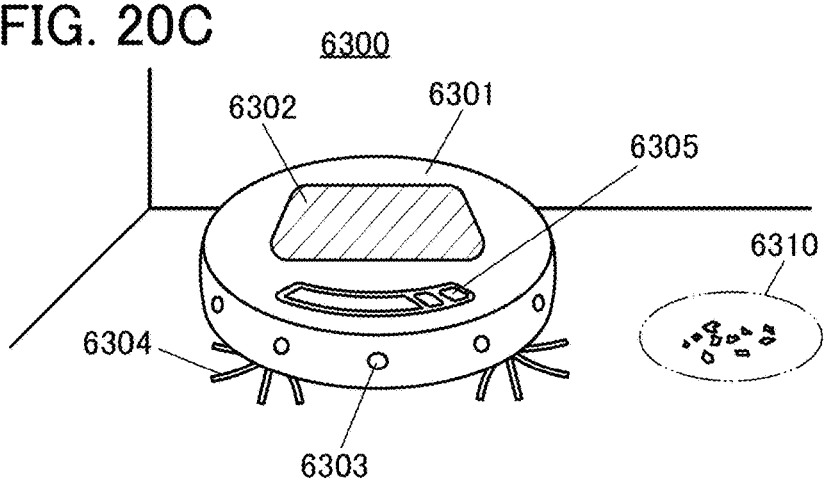

FIG. 20C illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although not illustrated, the cleaning robot 6300 is provided with a tire, an inlet, and the like. The cleaning robot 6300 is self-propelled, detects dust 6310, and sucks up the dust through the inlet provided on the bottom surface.

For example, the cleaning robot 6300 can determine whether there is an obstacle such as a wall, furniture, or a step by analyzing images taken by the cameras 6303. In the case where the cleaning robot 6300 detects an object, such as a wire, that is likely to be caught in the brush 6304 by image analysis, the rotation of the brush 6304 can be stopped. The cleaning robot 6300 further includes a secondary battery and the semiconductor device of one embodiment of the present invention or the electronic component. The cleaning robot 6300 including the semiconductor device of one embodiment of the present invention or the electronic component can function as an IoT device.

Figure 20D:
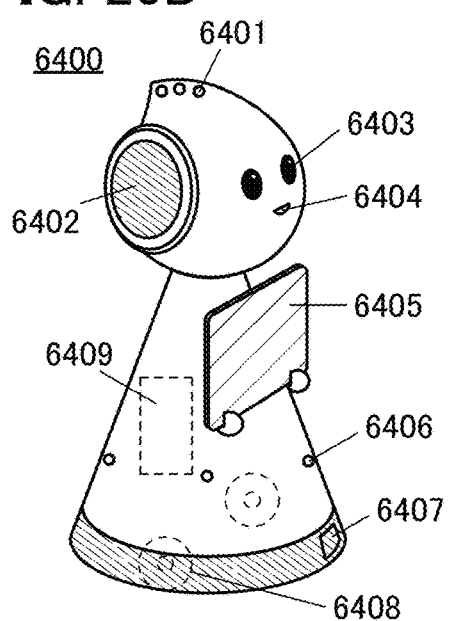

FIG. 20D illustrates an example of a robot. A robot 6400 illustrated in FIG. 20D includes an arithmetic unit 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user using the microphone 6402 and the speaker 6404.

The display portion 6405 has a function of displaying various kinds of information. The robot 6400 can display information desired by a user on the display portion 6405. The display portion 6405 may be provided with a touch panel. Moreover, the display portion 6405 may be a detachable information terminal, in which case charging and data communication can be performed when the display portion 6405 is set at the home position of the robot 6400.

The upper camera 6403 and the lower camera 6406 have a function of taking an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407. The light-emitting device of one embodiment of the present invention can be used for the display portion 6405.

The robot 6400 further includes a secondary battery and the semiconductor device of one embodiment of the present invention or the electronic component. The robot 6400 including the semiconductor device of one embodiment of the present invention or the electronic component can function as an IoT device.

Figure 20E:
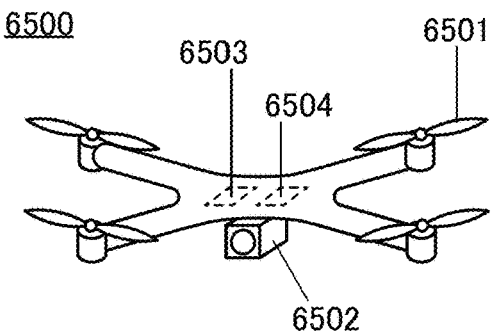

FIG. 20E illustrates an example of a flying object. A flying object 6500 illustrated in FIG. 20E includes propellers 6501, a camera 6502, a battery 6503, and the like and has a function of flying autonomously.

For example, image data taken by the camera 6502 is stored in an electronic component 6504. The electronic component 6504 can analyze the image data to detect whether there is an obstacle in the way of the movement. Moreover, the electronic component 6504 can estimate the remaining battery level from a change in the power storage capacity of the battery 6503. The flying object 6500 further includes the semiconductor device of one embodiment of the present invention or the electronic component. The flying object 6500 including the semiconductor device of one embodiment of the present invention or the electronic component can function as an IoT device.

Figure 20F:
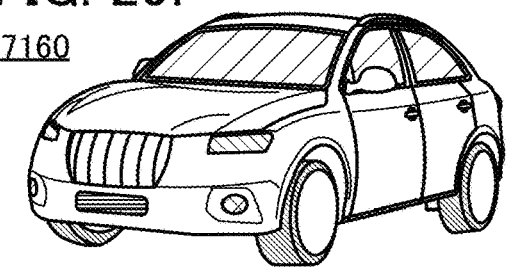

FIG. 20F illustrates an example of an automobile. An automobile 7160 includes an engine, tires, a brake, a steering gear, a camera, and the like. The automobile 7160 further includes the semiconductor device of one embodiment of the present invention or the electronic component. The automobile 7160 including the semiconductor device of one embodiment of the present invention or the electronic component can function as an IoT device.

The composition, structure, method, and the like described in this embodiment can be used in combination as appropriate with the compositions, structures, methods, and the like described in the other embodiments and the like.

Embodiment 7

The use of the OS transistor described in this specification and the like enables a normally-off CPU (also referred to as "Noff-CPU") to be obtained. Note that the Noff-CPU is an integrated circuit including a normally-off transistor, which is in a non-conduction state (also referred to as off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff-CPU can be reduced without a significant decrease in operation speed.

The Noff-CPU can be suitably used for a small-scale system such as an IoT end device (also referred to as endpoint microcomputer) 803 in the IoT field, for example.

Figure 21:
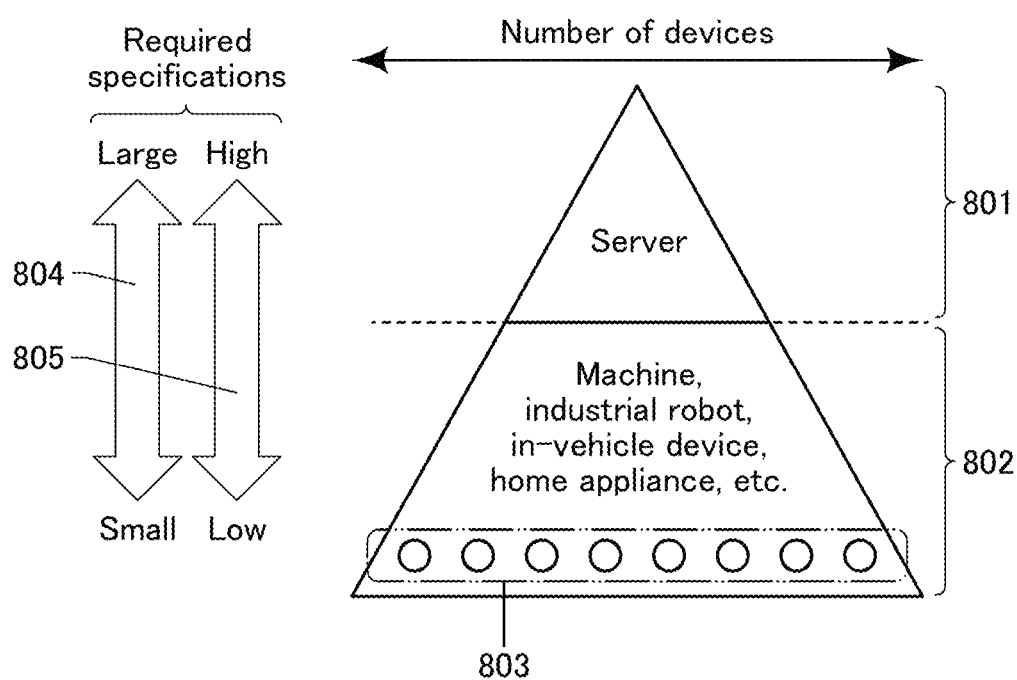
FIG. 21 is a diagram illustrating a hierarchical structure of an IoT network and tendencies of required specifications.

FIG. 21 illustrates a hierarchical structure of an IoT network and tendencies of required specifications. FIG. 21 illustrates power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

At the upper level, higher processing performance is required rather than lower power consumption. Thus, a high-performance CPU, a high-performance GPU, a large-scale SoC, and the like are used in the cloud field 801. Furthermore, at the lower level, lower power consumption is required rather than higher processing performance, and the number of devices is explosively increased. The semiconductor device of one embodiment of the present invention can be suitably used for a communication device in the IoT end device that needs to have low power consumption.

Note that an "endpoint" refers to an end region of the embedded field 802. Examples of a device used in the endpoint include microcomputers used in a factory, a home appliance, infrastructure, agriculture, and the like.

Figure 22:
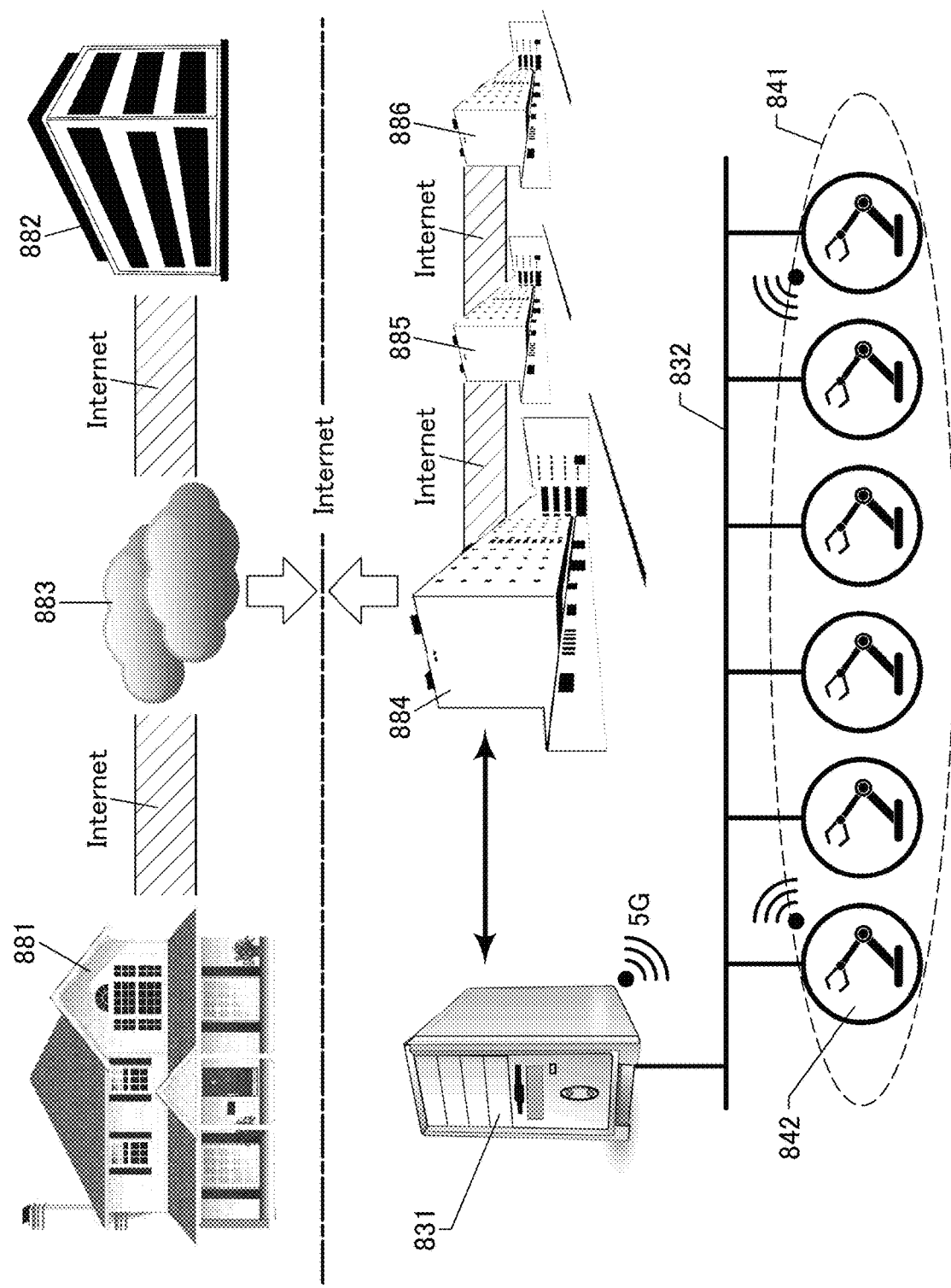
FIG. 22 is a conceptual diagram of factory automation.

FIG. 22 is a conceptual diagram of factory automation as an application example of the endpoint microcomputer. A factory 884 is connected to a cloud 883 through Internet connection. The cloud 883 is connected to a home 881 and an office 882 through Internet connection. The Internet connection may be wired communication or wireless communication. In the case of wireless communication, for example, wireless communication based on a communication standard such as the fourth-generation mobile communication system (4G) or the fifth-generation mobile communication system (5G) can be performed using the semiconductor device of one embodiment of the present invention for a communication device. The factory 884 may be connected to a factory 885 and a factory 886 through Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through an M2M (Machine to Machine) interface 832. As the M2M interface 832, for example, industrial Ethernet ("Ethernet" is a registered trademark), which is a kind of wired communication, or local 5G, which is a kind of wireless communication, may be used.

A manager of the factory can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories, under the name "Smart Factory". Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the Noff-CPU. Although the embedded field of IoT sometimes requires quick response, the use of the Noff-CPU achieves high-speed return from a standby state.

The composition, structure, method, and the like described in this embodiment can be used in combination as appropriate with the compositions, structures, methods, and the like described in the other embodiments and the like.

100A: semiconductor device, 100B: semiconductor device, 100C: semiconductor device, 110A: mixer circuit, 110B: mixer circuit, 111: voltage-to-current conversion portion, 112: current switch portion, 113: current-to-voltage conversion portion, 115: terminal, 116: terminal, 120: bias circuit, 121: terminal, 122: bias supply portion, 123: buffer portion, 124: voltage holding portion, 125: operational amplifier, 126: terminal, 127: terminal, 128: terminal, 129: terminal, 201: low noise amplifier, 202: mixer, 203: low-pass filter, 204: variable gain amplifier, 205: analog-digital converter circuit, 206: interface portion, 207: digital-analog converter circuit, 208: variable gain amplifier, 209: low-pass filter, 210: mixer, 211: power amplifier, 212: oscillation circuit This application is based on Japanese Patent Application Serial No. 2020-085605 filed on May 15, 2020, the entire contents are hereby incorporated herein by reference.

The invention claimed is:

1. A semiconductor device comprising a mixer circuit and a bias circuit,
   wherein the mixer circuit comprises a voltage-to-current conversion portion, a current switch portion, and a current-to-voltage conversion portion,
   wherein the bias circuit comprises a bias supply portion and a first transistor,
   wherein the voltage-to-current conversion portion comprises a second transistor and a third transistor,
   wherein the bias circuit is configured to output a bias voltage to be supplied to a gate of the second transistor and a gate of the third transistor,
   wherein one of a source and a drain of the first transistor is electrically connected to the gate of the second transistor and the gate of the third transistor,
   wherein the bias circuit comprises a voltage holding portion electrically connected to the bias supply portion, and a buffer portion electrically connected to the voltage holding portion,
   wherein an output of the buffer portion is electrically connected to the gate of the second transistor and the gate of the third transistor,
   wherein the voltage holding portion is configured to hold the bias voltage, and
   wherein the buffer portion is configured to amplify power of the bias voltage.

2. The semiconductor device according to claim 1,
   wherein the voltage holding portion comprises a fourth transistor, and
   wherein the fourth transistor comprises an oxide semiconductor in a channel formation region.

3. The semiconductor device according to claim 1,
   wherein the first transistor comprises an oxide semiconductor in a channel formation region.

4. The semiconductor device according to claim 2,
   wherein the oxide semiconductor comprises at least one of indium and zinc.

5. The semiconductor device according to claim 1,
   wherein the second transistor and the third transistor each comprise a nitride semiconductor in a channel formation region.

6. The semiconductor device according to claim 5,
   wherein the nitride semiconductor comprises gallium.

7. A semiconductor device comprising a mixer circuit and a bias circuit,
   wherein the mixer circuit comprises a voltage-to-current conversion portion, a current switch portion, and a current-to-voltage conversion portion,
   wherein the bias circuit comprises a bias supply portion and a first transistor,
   wherein the voltage-to-current conversion portion comprises a second transistor and a third transistor,
   wherein the bias circuit is configured to output a bias voltage to be supplied to a gate of the second transistor and a gate of the third transistor,
   wherein one of a source and a drain of the first transistor is electrically connected to the gate of the second transistor and the gate of the third transistor,
   wherein the first transistor is turned off when the bias voltage is supplied, and
   wherein the first transistor is turned on when the supply of the bias voltage is stopped.

8. A semiconductor device comprising a mixer circuit and a bias circuit,
   wherein the mixer circuit comprises a voltage-to-current conversion portion, a current switch portion, and a current-to-voltage conversion portion,
   wherein the bias circuit comprises a bias supply portion and a first transistor,
   wherein the voltage-to-current conversion portion comprises a second transistor and a third transistor,
   wherein the bias circuit is configured to output a bias voltage to be supplied to a gate of the second transistor and a gate of the third transistor,
   wherein one of a source and a drain of the first transistor is electrically connected to the gate of the second transistor and the gate of the third transistor,
   wherein the semiconductor device is configured to output third signal with the use of a first signal having a first frequency input to the voltage-to-current conversion portion and a second signal having a second frequency input to the current switch portion,
   wherein the third signal comprises a first frequency component obtained by subtracting the second frequency from the first frequency and a second frequency component obtained by adding the second frequency to the first frequency, and
   wherein the first frequency is higher than the second frequency.

* * * * *